(12) United States Patent
Hyun et al.

(10) Patent No.: US 10,700,228 B2
(45) Date of Patent: Jun. 30, 2020

(54) METHOD FOR MANUFACTURING SOLAR CELL MODULE HAVING DEFECT TESTED SOLAR CELL STRINGS

(71) Applicant: LG ELECTRONICS INC., Seoul (KR)

(72) Inventors: Daeseon Hyun, Seoul (KR); Bojoong Kim, Seoul (KR); Byungjun Kang, Seoul (KR); Junhan Kwon, Seoul (KR); Minpyo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 108 days.

(21) Appl. No.: 15/687,002

(22) Filed: Aug. 25, 2017

(65) Prior Publication Data

US 2018/0062016 A1    Mar. 1, 2018

(30) Foreign Application Priority Data

Aug. 26, 2016  (KR) .................. 10-2016-0109413
Aug. 4, 2017   (KR) .................. 10-2017-0098954

(51) Int. Cl.
*H01L 31/05*     (2014.01)
*H01L 31/068*    (2012.01)
(Continued)

(52) U.S. Cl.
CPC .. *H01L 31/0504* (2013.01); *H01L 31/022441* (2013.01); *H01L 31/048* (2013.01);
(Continued)

(58) Field of Classification Search
CPC .......... H01L 31/022441; H01L 31/048; H01L 31/0504; H01L 31/0516; H01L 31/0682;
(Continued)

(56) References Cited

U.S. PATENT DOCUMENTS 6,512,458 B1 * 1/2003 Kobayashi .............. H02S 50/10
                                                    340/507
2011/0073165 A1 * 3/2011 Lee ................. H01L 31/022441
                                                    136/251
(Continued)

FOREIGN PATENT DOCUMENTS

| EP | 2752888 A1 | 7/2014 |
|----|------------|--------|
| EP | 2752889 A1 | 7/2014 |
| EP | 2983212 A1 | 2/2016 |
| JP | 2012-49390 A | 3/2012 |
| JP | 2016-5002 A | 1/2016 |
| KR | 10-1642231 B1 | 7/2016 |

*Primary Examiner* — Duy T Nguyen
(74) *Attorney, Agent, or Firm* — Birch, Stewart, Kolasch & Birch, LLP

(57) ABSTRACT

A solar cell module and a method of manufacturing the same are provided. The method of manufacturing a solar cell module includes forming a plurality of strings to which a plurality of solar cells are connected; disposing a target string at a repair device, the target string including a target solar cell having a defect; separating the target solar cell from the target string by selectively thermally processing a connection area of a target intercell connector and the plurality of conductive wirings fixed to the target solar cell; disposing a new solar cell at the target string; and connecting the plurality of conductive wirings fixed to the new solar cell to the target intercell connector.

6 Claims, 25 Drawing Sheets

(51) Int. Cl.
*H01L 31/0224* (2006.01)
*H01L 31/18* (2006.01)
*H01L 31/048* (2014.01)
*H02S 50/10* (2014.01)

(52) U.S. Cl.
CPC ...... *H01L 31/0516* (2013.01); *H01L 31/0682* (2013.01); *H01L 31/1804* (2013.01); *H01L 31/188* (2013.01); *H02S 50/10* (2014.12); *Y02E 10/547* (2013.01); *Y02P 70/521* (2015.11)

(58) Field of Classification Search
CPC ... H01L 31/1804; H01L 31/188; H02S 50/10; Y02E 10/547; Y02P 70/521
See application file for complete search history.

(56) References Cited

U.S. PATENT DOCUMENTS

| | | | |
|---|---|---|---|
| 2013/0037079 A1* | 2/2013 | Hishida | H01L 31/0512 136/244 |
| 2013/0213452 A1* | 8/2013 | Ide | H01L 31/0516 136/244 |
| 2013/0240022 A1* | 9/2013 | Sewell | H01L 31/022441 136/251 |
| 2014/0157580 A1* | 6/2014 | Fukumochi | H01L 31/0512 29/593 |
| 2015/0243798 A1* | 8/2015 | Woo | H01L 31/0516 136/244 |
| 2016/0329863 A1* | 11/2016 | Higuchi | H02S 50/00 |

\* cited by examiner

METHOD FOR MANUFACTURING SOLAR CELL MODULE HAVING DEFECT TESTED SOLAR CELL STRINGS

This application claims the priority benefit of Korean Patent Application No. 10-2016-0109413 filed on Aug. 26, 2016, and No. 10-2017-0098954, filed on Aug. 4, 2017, in the Korean Intellectual Property Office, the disclosures of all of which are incorporated herein by reference.

BACKGROUND OF THE INVENTION

Field of the Invention

Embodiments of the present invention relate to a solar cell module and a method of manufacturing the same.

Description of the Related Art

Nowadays, while depletion of an existing energy resource such as oil or coal is estimated, interest in alternative energy to replace the existing energy resource increases and thus a solar cell that generates electric energy with sun energy has been in the spotlight.

A general solar cell includes a semiconductor portion that forms a p-n junction by different conductive types such as in a p-type and an n-type and electrodes connected to different conductive type semiconductor portions, respectively.

When light is applied to such a solar cell, a plurality of electron-hole pairs are generated in the semiconductor portion, and the generated electron-hole pair each are separated into electrons and holes, which are electric charges, and the electrons move toward an n-type semiconductor portion and the holes move toward a p-type semiconductor portion. The moved electrons and holes each are collected by different electrodes connected to the n-type semiconductor portion and the p-type semiconductor portion and by connecting the electrodes by wires, power is obtained.

A plurality of solar cells may be connected by an interconnector to be formed in a module.

However, when expansion and contraction of an interconnector that connects a plurality of solar cells is repeated by a temperature change, a problem may occur that the interconnector is separated in a portion of weak adhesion. In a production process of a solar cell module, when a defect is found in some solar cells, it is difficult to replace only a solar cell having a defect. Particularly, in a rear contact solar cell whose entire electrode is formed at a rear surface of a semiconductor substrate among solar cells, because an interconnector is overlapped and connected with the rear surface of the solar cell, such a problem may become further serious. Therefore, an inferiority rate of the solar cell module may increase and an output and long term reliability may be deteriorated.

SUMMARY OF THE INVENTION

Embodiments of the present invention have been made in view of the above problems and provide a solar cell module that can prevent a failure and that have a high output and excellent long term reliability.

The embodiments of the present invention further provide a method of manufacturing a solar cell module that can more easily replace a solar cell in which a defect is found.

In accordance with an aspect of the present invention, a method of manufacturing a solar cell module includes forming a plurality of strings connected to using a plurality of solar cells arranged in a first direction by commonly connecting a plurality of conductive wirings fixed to a rear surface of each of a the plurality of solar cells arranged in a first direction to a rear surface of an a plurality of intercell connectors disposed between the plurality of solar cells each, respectively; disposing a target string among the plurality of strings at a repair device such that a rear surface of the target string faces upward, the target string including a target solar cell having a defect among the plurality of strings faces upward; separating the target solar cell from the target string by selectively thermally processing a connection area of a target intercell connector among the plurality of intercell connector and a the plurality of conductive wirings fixed to the target solar cell in the target string; disposing a new solar cell at the target string such that a plurality of conductive wirings fixed to the new solar cell are overlapped with the target intercell connector; and coupling a new cell of connecting a plurality of the conductive wirings fixed to the new solar cell to the target intercell connector by selectively thermally processing an overlapping area of the target intercell connector and a plurality of the conductive wirings fixed to the new solar cell.

In accordance with another aspect of the present invention, a solar cell module includes a plurality of solar cells each arranged in a first direction, and having a semiconductor substrate and a plurality of first and second electrodes having different polarities at a at the rear surface of a semiconductor substrate, the plurality of first and second electrodes having different polarities; a plurality of conductive wirings long disposed in the first direction at a the rear surface of a the semiconductor substrate of each of the plurality of solar cells to be, the plurality of conductive wirings being connected to the rear surface of the semiconductor substrate through a first conductive adhesive; and a plurality of intercell connectors long disposed in a second direction intersecting the first direction between each of the plurality of solar cells and to which, wherein the plurality of conductive wirings connected to each of the plurality of solar cells are are commonly connected to the plurality of intercell connectors through a second conductive adhesive, wherein a first target intercell connector and a second target intercell connector among the plurality of target intercell connectors are provided at each of both side surfaces of at least one solar cell of the plurality of solar cells, a target intercell connector, which is a portion of the plurality of intercell connectors is provided, a the plurality of conductive wirings connected to the at least one solar cell and a the plurality of conductive wirings connected to a solar cell adjacent solar cells to at both sides of the at least one solar cell are commonly connected to the first and second target intercell connectors, respectively, and a coating area of each of the second conductive adhesives adhesive that connects a the plurality of conductive wirings connected to the at least one solar cell to the first and second target intercell connectors is larger than that of each of a coating area of the second conductive adhesives adhesive that connects a the plurality of conductive wirings connected to the adjacent solar cells to the first and second target intercell connectors.

In accordance with another aspect of the present invention, a solar cell module includes a solar cell; a wiring portion electrically connected to the solar cell; and a fixing member including a portion positioned at an outer edge of the solar cell to fix the wiring portion.

In a solar cell module and a method of manufacturing the same according to an example embodiment of the present invention, in a production process, by separating and replacing only a target solar cell having a defect from a string, a yield rate of the production process can be enhanced. According to the present example embodiment, strength of a wiring portion is reinforced by a fixing member and damage and separation of the wiring portion is prevented and thus fixing stability of the wiring portion can be enhanced. Particularly, after replacing a solar cell having a failure or a fault, by positioning a fixing member at an outer edge of the replaced solar cell, fixing stability of the replaced solar cell can be enhanced. Therefore, output deterioration and a failure of a solar cell module can be prevented and long term reliability can be greatly enhanced.

DETAILED DESCRIPTION OF THE EMBODIMENTS

Figure 1:
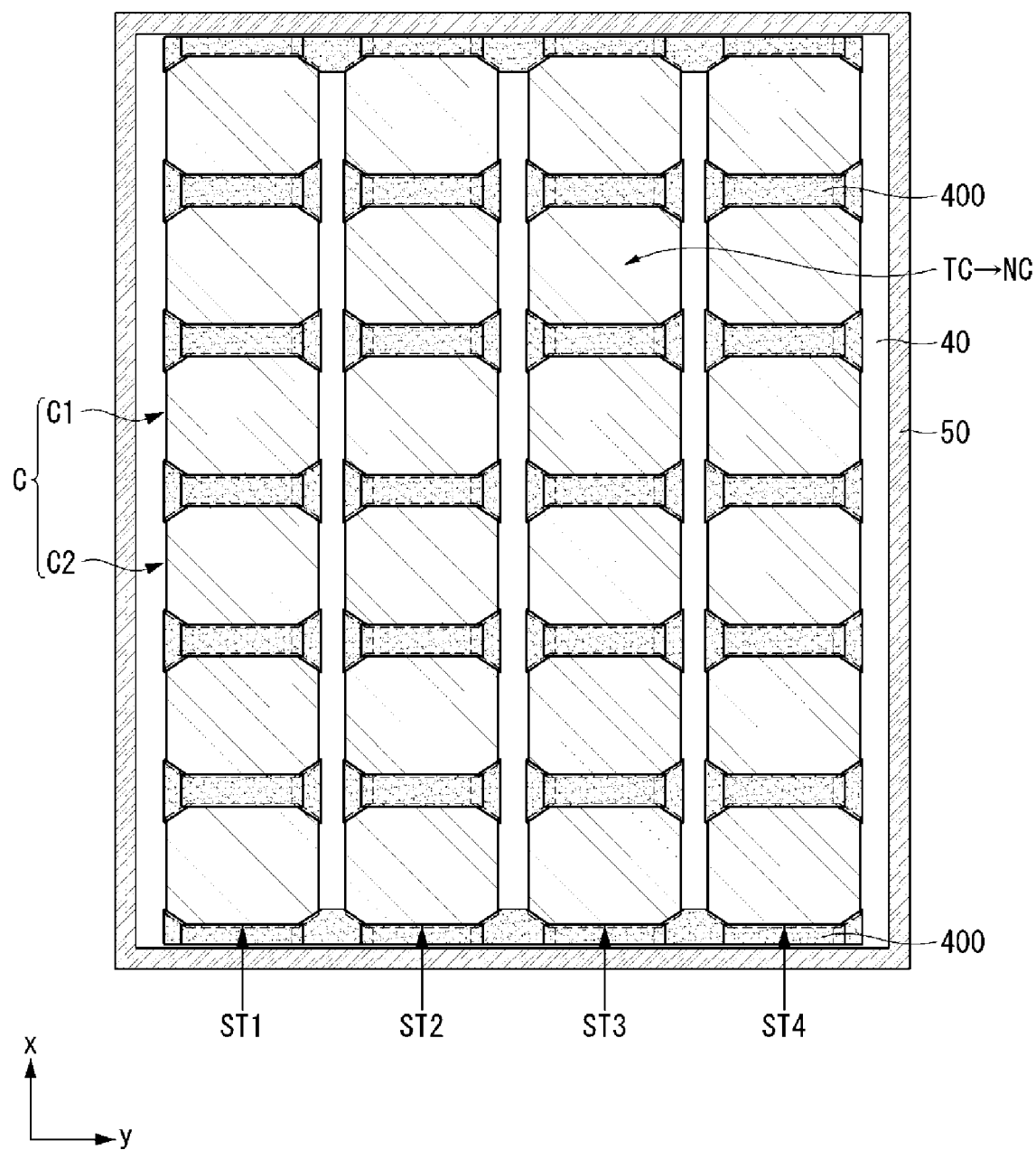
FIG. 1 is a diagram illustrating an entire plane shape of a front surface of a solar cell module according to an example embodiment of the present invention.

The embodiments of the present invention will be described more fully hereinafter with reference to the accompanying drawings, in which example embodiments of the invention are shown. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In the drawings, the thickness of layers and areas are exaggerated for clarity. When it is said that any part, such as a layer, film, region, or plate, is positioned "on" another part, it means that the part is "directly on" the other part or above the other part with at least one intermediate part. In contrast, when any portion is formed "directly on" another portion, it means that there is no intermediate portion between the two portions. Further, when any portion is "entirely" formed on another portion, the any portion may be formed at an entire surface of the another portion and may not be formed at a portion of an edge.

Hereinafter, a front surface may be one surface of a semiconductor substrate to which direct light is applied, and a rear surface may be an opposite surface of a semiconductor substrate to which direct light may not be applied or to which reflected light instead of direct light may be applied.

Further, hereinafter, a cell string means a structure or a form in which a plurality of solar cells are connected in series.

Further, when a thickness or a width of any configuration portion is the same as a thickness or a width of another configuration portion, it means that they are the same within a range of 10% including a process error.

Figure 2:
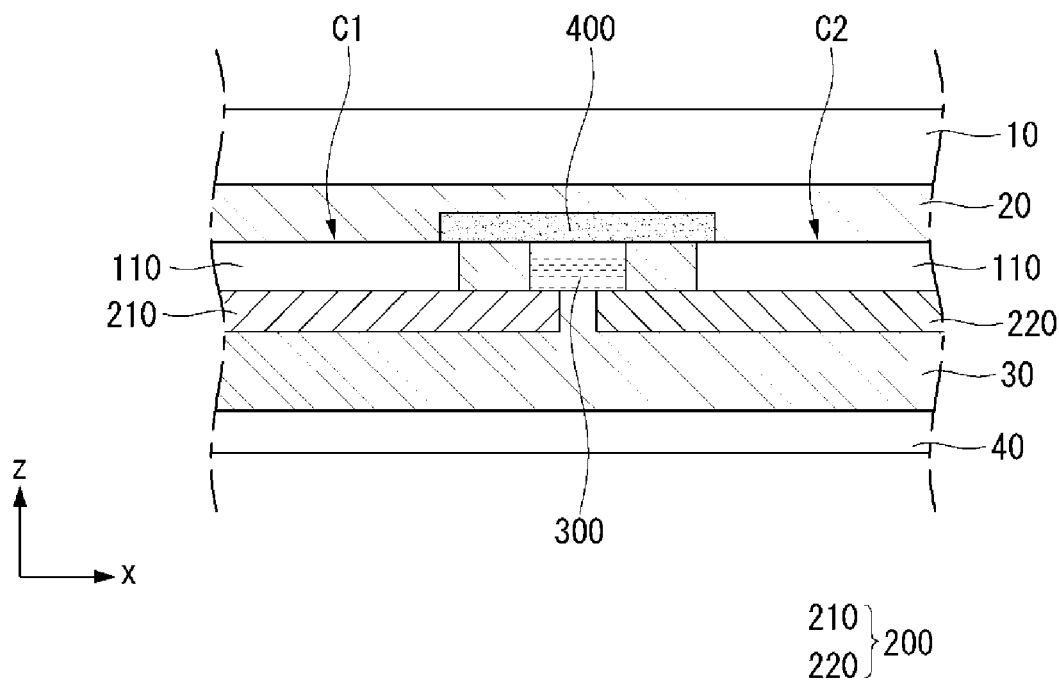
FIG. 2 is a cross-sectional view of first and second solar cells adjacent in a first direction x of FIG. 1 and connected by an intercell connector.

FIG. 1 is a diagram illustrating an entire plane shape of a front surface of a solar cell module according to an example embodiment of the present invention, and FIG. 2 is a cross-sectional view of first and second solar cells C1 and C2 adjacent in a first direction x of FIG. 1 and connected by wiring portions 200 and 300.

As shown in FIGS. 1 and 2, a solar cell module according to an example embodiment of the present invention includes a plurality of solar cells C and wiring portions 200 and 300 that connect the plurality of solar cells C. In this instance, the wiring portions 200 and 300 may include a plurality of conductive wirings 200 connected to a rear surface of the solar cell C and an intercell connector 300 that connects in series a plurality of solar cells in a first direction x. The wiring portions 200 and 300 may further include a busbar wiring that positions at both end portions of a cell string to connect the cell string to another cell string or a junction box. The solar cell module may further include a shield 400 that enables a solar cell module to have an enhanced external appearance.

The solar cell module may further include a front transparent substrate 10 that encapsulates cell strings ST1-ST3 in which a plurality of solar cells are connected in series, fillers 20 and 30, a rear sheet 40, and a frame 50.

As shown in FIG. 1, a plurality of solar cells C each are long arranged in a first direction x, and a plurality of first electrodes 141 and second electrodes 142 may be provided at a semiconductor substrate 110 and a rear surface, respectively, of the semiconductor substrate 110. Such a plurality of solar cells will be described in more detail hereinafter with reference to FIG. 6 and subsequent figures.

As shown in FIGS. 1 and 2, a plurality of conductive wirings 200 may be long connected in a first direction to a rear surface of each of a plurality of solar cells C.

Further, the plurality of conductive wirings 200 each may be protruded to the outside of a projection area of each solar cell.

As shown in FIG. 2, the plurality of conductive wirings 200 connected to each of a plurality of solar cells C are commonly connected to the intercell connector 300 at the outside of a projection area of each solar cell and thus a plurality of solar cells may be connected in series in a first direction x.

In this instance, the intercell connector 300 may be disposed between each solar cell and be separated from the each solar cell.

As shown in FIG. 2, a front surface of a plurality of first conductive wirings 210 connected to the first solar cell C1 and a front surface of a plurality of second conductive wirings 220 connected to the second solar cell C2 may be connected to a rear surface of the intercell connector 300 and thus a cell string may be formed in which a plurality of solar cells are connected in series.

Further, as shown in FIGS. 1 and 2, the shield 400 is attached to a front surface of the intercell connector 300 to visually block a plurality of conductive wirings 200 and the intercell connector 300 exposed at a space between solar cells, thereby enabling a solar cell module to have an enhanced external appearance.

In this instance, a color of a light receiving surface of the shield 400 may be the same color as or the same color series as that of a rear sheet 40 viewed between cell strings. Accordingly, the shield 400 and the rear sheet 40 may not be visually distinguished and may have a similar color or the same color.

As shown in FIG. 2, the cell string may be thermally pressed and laminated with disposed between a front transparent substrate 10 and the rear sheet 40.

For example, a plurality of solar cells may be disposed between the front transparent substrate 10 and the rear sheet 40, and in a state in which the transparent fillers 20 and 30 such as an EVA sheet are disposed at a front surface and a rear surface of the entire of a plurality of solar cells, the plurality of solar cells may be integrally formed and encapsulated by a lamination process in which a heat and a pressure are simultaneously applied.

Further, as shown in FIG. 1, edges of the front transparent substrate 10, the rear sheet 40, and the fillers 20 and 30 encapsulated in a lamination process are fixed by the frame 50 and thus the front transparent substrate 10, the rear sheet 40, and the fillers 20 and 30 may be protected.

Here, the front transparent substrate 10 may be formed with reinforcing glass having high transmittance and an excellent damage prevention function.

The rear sheet 40 may prevent moisture from penetrating from a rear surface of the solar cells C1 and C2 to protect the solar cell from an external environment. Such a rear sheet 40 may have a multiple layer structure such as a layer that prevents penetration of moisture and oxygen and a layer that prevents chemical corrosion.

Such a rear sheet 40 may be formed with a thin sheet made of an insulating material such as fluoropolymer (FP)/polyester (PE)/fluoropolymer (FP), but may be an insulating sheet made of other insulating materials.

Such a lamination process may be performed in a state in which surface-shaped fillers 20 and 30 are disposed between the front transparent substrate 10 and the solar cells and between the solar cell and the rear substrate.

Here, the fillers 20 and 30 may be made of a material different from that of an insulating layer (252 of FIG. 4), prevent corrosion due to moisture penetration, and protect the solar cells C1 and C2 from an impact, and for this reason, the fillers 20 and 30 may be made of a material such as ethylene vinyl acetate (EVA) that can absorb an impact.

Therefore, the surface-shaped fillers 20 and 30 disposed between the front transparent substrate 10 and the solar cells and between the solar cell and the rear substrate may be softened and hardened by a heat and a pressure in a lamination process.

Therefore, the rear filler 30 may directly physically contact a rear surface of the intercell connector 300 and the plurality of conductive wirings 200, and the front filler 20 may directly physically contact a front surface of the shield 400.

Hereinafter, in the solar cell module of FIGS. 1 and 2, a structure in which a plurality of solar cells are connected in series by the conductive wiring 200 and the intercell connector 300 will be described in detail.

Figure 3:
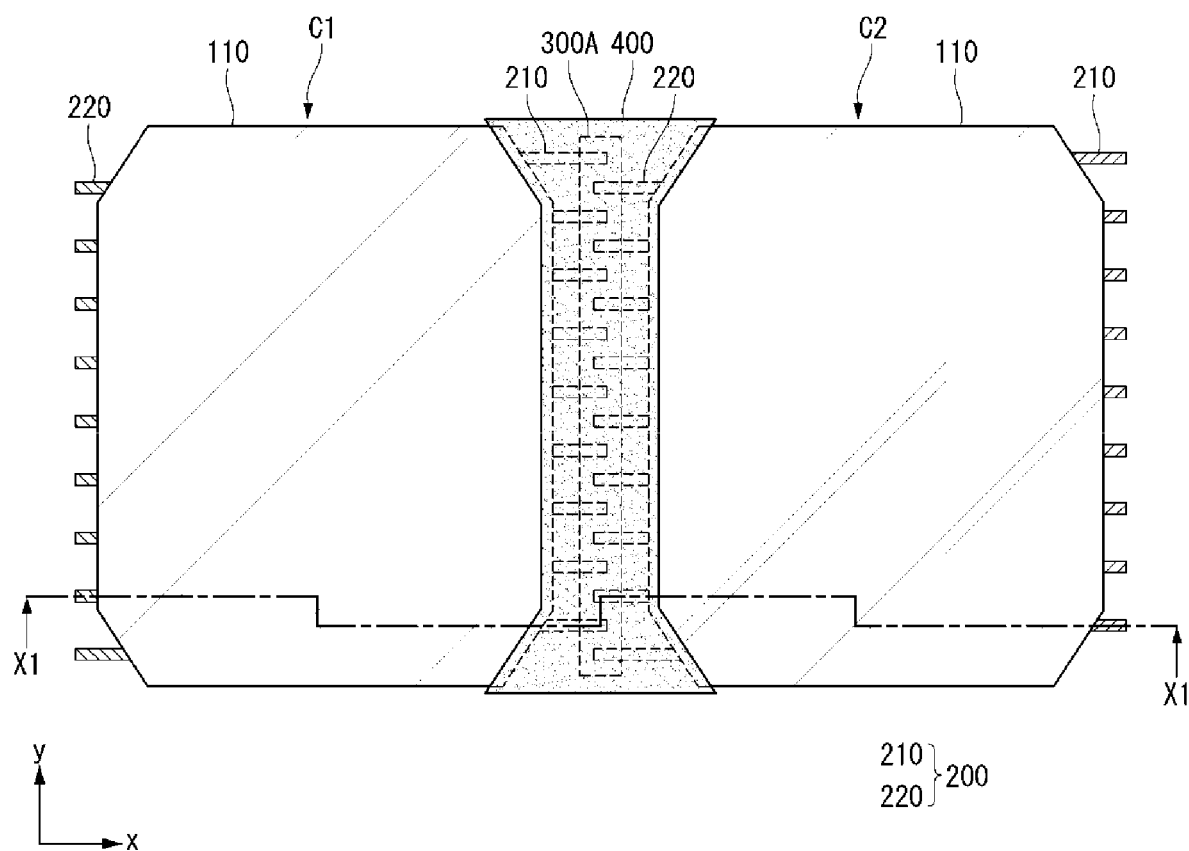
FIGS. 3 to 5 are diagrams illustrating a series connection structure of first and second solar cells of FIG. 1.
Figure 4:
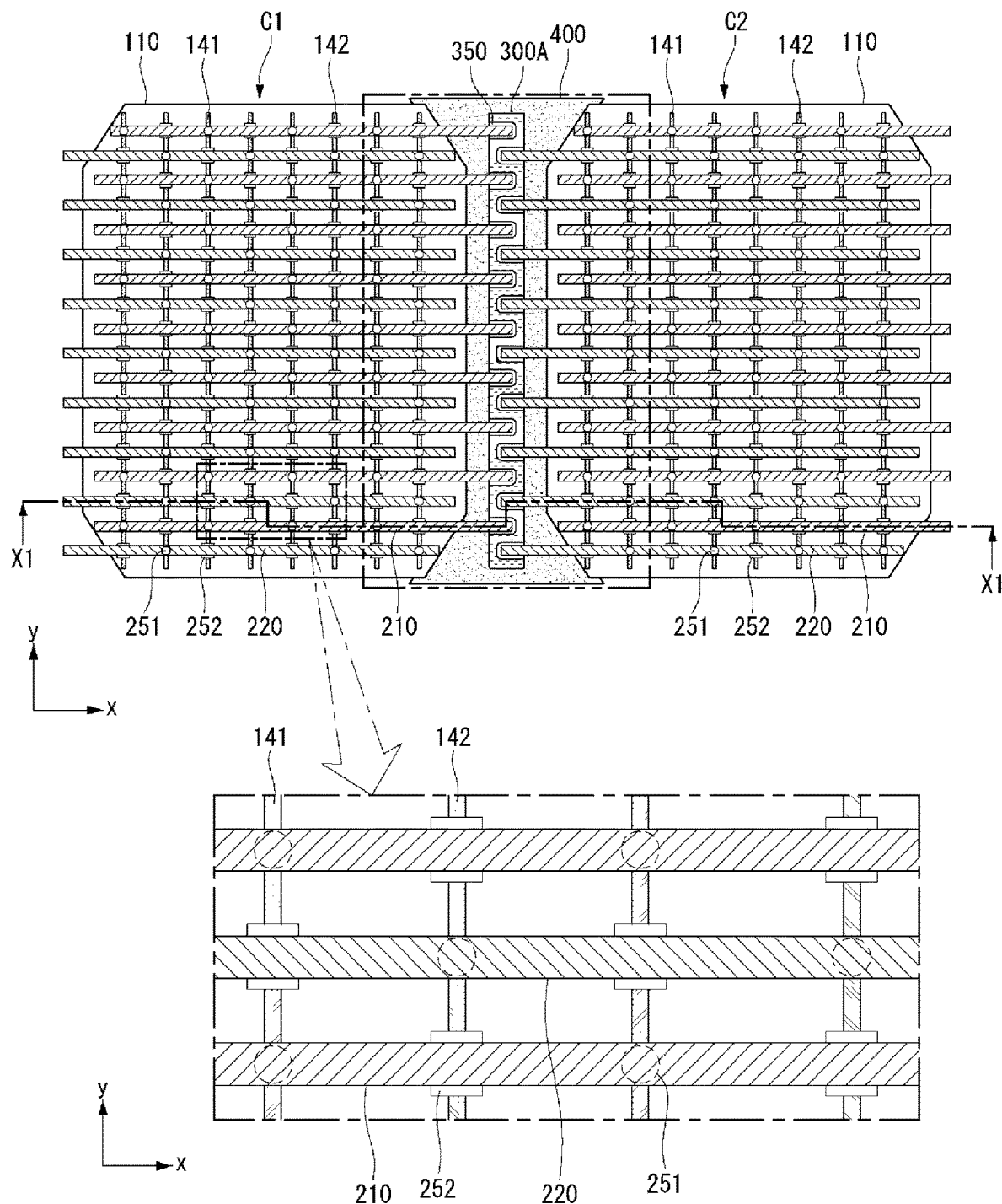
Figure 5:
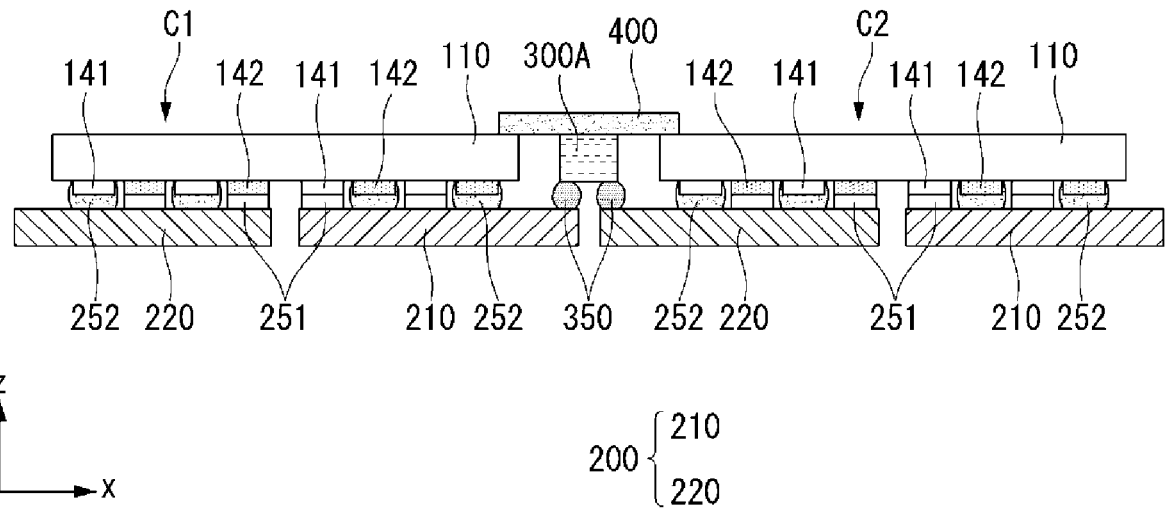

FIGS. 3 to 5 are diagrams illustrating a series connection structure of first and second solar cells C1 and C2 of FIG. 1.

FIG. 3 illustrates a front surface of the first and second solar cells C1 and C2 adjacent in a first direction x of FIG. 1 and connected by an intercell connector 300A, FIG. 4 illustrates a rear surface of the first and second solar cells C1 and C2 of FIG. 3, and FIG. 5 is a cross-sectional view taken along line X1-X1 of FIGS. 3 and 4.

As shown in FIGS. 3 and 4, in a solar cell module according to an example embodiment of the present invention, the conductive wiring 200 may be connected to a rear surface of a semiconductor substrate 110 provided in the first and second solar cells C1 and C2.

Here, the first and second solar cells C1 and C2 may be separately arranged in a first direction x, and as shown in FIG. 4, the first and second solar cells C1 and C2 may include a plurality of first electrodes 141 and a plurality of second electrodes 142, respectively, long extended in a second direction y intersecting a first direction x and separated from each other in at least the semiconductor substrate 110 and a rear surface of the semiconductor substrate 110.

Further, the plurality of conductive wirings 200 may be long extended in a first direction x, which is an arrangement direction of the first and second solar cells C1 and C2 and may be connected to the first and second solar cells C1 and C2, respectively.

The plurality of conductive wirings 200 may include a plurality of first conductive wirings 210 connected to cross and overlap with a plurality of first electrodes 141 provided at each of the first and second solar cells C1 and C2 and a plurality of second conductive wirings 220 connected to cross and overlap with a plurality of second electrodes 142.

More specifically, in each of a plurality of solar cells C1 and C2, a plurality of first conductive wirings 210 may be connected to the first electrodes 141 through a first conductive adhesive 251 of a conductive material at a plurality of intersections intersecting the first electrodes 141 and may be insulated from the second electrode 142 by the insulating layer 252 of an insulating material at a plurality of intersections intersecting the second electrodes 142.

Further, in a plurality of solar cells C1 and C2 each, a plurality of second conductive wirings 220 may be connected to the second electrodes 142 through the first conductive adhesive 251 at a plurality of intersections intersecting the second electrodes 142 and may be insulated from the first electrodes 141 by the insulating layer 252 at a plurality of intersections intersecting the first electrodes 141.

The conductive wiring 200 may include a conductive core made of a conductive metal material and including any one of gold (Au), silver (Ag), copper (Cu), and aluminum (Al) and a conductive coating layer that coats a surface of a core CR and including tin (Sn) or an alloy including tin (Sn).

As an example, a core may be formed with copper (Cu), and a coating layer may be formed with SnBiAg, which is an alloy including tin (Sn).

One end connected to the intercell connector 300A among both ends of the first conductive wiring 210 may be protruded to the outside of a first side surface of the semiconductor substrate 110, and one end connected to the intercell connector 300A among both ends of the second conductive wiring 220 may be protruded to the outside of a second side surface of the semiconductor substrate 110.

Here, the first side surface may mean any one side surface intersecting when advancing in a first direction x in the semiconductor substrate 110, and the second side surface may mean an opposite side surface facing a first side surface in the semiconductor substrate 110.

Therefore, one end of the first conductive wiring 210 and one end of the second conductive wiring 220 each may be protruded to the outside of a projection area of the semiconductor substrate, and the other end of the first conductive wiring 210 and the other end of the second conductive wiring 220 may be positioned within a projection area of the semiconductor substrate.

Here, the plurality of conductive wirings 200 may have a conductive wire form having a circular cross-section or a ribbon form in which a width is larger than a thickness.

Here, a line width of each of the conductive wirings 200 of FIGS. 4 and 5 may have a value between 0.5 mm-2.5 mm in consideration that a production cost becomes a minimum while maintaining line resistance of a conductive wiring to be fully low, and a gap between the first conductive wiring 210 and the second conductive wiring 220 may have a value between 4 mm-6.5 mm such that a short circuit current of the solar cell module is not damaged in consideration of the total number of the conductive wiring 200.

In this way, the number of the conductive wirings 200 connected to one solar cell may be 10 to 20. Therefore, the sum of the number of the conductive wirings 200 connected to one solar cell may be 20 to 40.

The first conductive adhesive 251 may be made of a conductive metal material and may be formed in any one form of a solder paste, an epoxy solder paste, or a conductive paste.

Here, a solder paste layer may be formed with tin (Sn) or an alloy including tin (Sn), and an epoxy solder paste layer may be formed with tin (Sn) or an alloy including tin (Sn) included in epoxy.

A structure of the first conductive adhesive 251 will be described in more detail hereinafter with reference to FIG. 10.

As shown in FIG. 4, the insulating layer 252 may be positioned at each of between the first conductive wiring 210 and the second electrode 142 and between the second conductive wiring 220 and the first electrode 141 at a plurality of intersections of the first conductive wirings 210 and the second electrodes 142 and a plurality of intersections of the second conductive wirings 220 and the first electrodes 141.

Further, the insulating layers 252 positioned at each of a plurality of intersections of the first conductive wirings 210 and the second electrodes 142 and a plurality of intersections of the second conductive wirings 220 and the first electrodes 141 may be separated from each other.

The insulating layer 252 may be made of any insulating material and for example, may use any one insulating material of epoxy-based, polyimide, polyethylene, acryl-based, or silicon-based.

One end of each of the plurality of conductive wirings 200 may be connected to the intercell connector 300A to connect in series a plurality of solar cells.

More specifically, the intercell connector 300A may be positioned between the first solar cell C1 and the second solar cell C2 and be long extended in a second direction y.

As shown in FIGS. 3 and 4, when viewed the solar cell in a plane, the intercell connector 300A may be separately disposed from the semiconductor substrate 110 of the first solar cell C1 and the semiconductor substrate 110 of the second solar cell C2.

Further, because one end of the first conductive wiring 210 connected to the first electrode 141 of the first solar cell C1 and one end of the second conductive wiring 220 connected to the second electrode 142 of the second solar cell C2 are commonly connected to the intercell connector 300A, the first and second solar cells C1 and C2 may be connected in series in a first direction x.

More specifically, as shown in FIG. 5, in a state in which the first and second solar cells C1 and C2 are arranged in a first direction x, the first and second solar cells C1 and C2 may form one string long extended in a first direction x to be connected in series by the conductive wiring 200 and the intercell connector 300A.

For example, as shown in FIG. 5, one end of each of the conductive wirings 200 may be overlapped with the intercell connector 300A to be bonded to the intercell connector 300A through a second conductive adhesive 350.

Here, a coating area of the second conductive adhesive 350 positioned between the intercell connector 300A and the first conductive wiring 210 connected to the first solar cell C1 may be the same as that of the second conductive adhesive 350 positioned between the intercell connector 300A and the second conductive wiring 220 connected to the second solar cell C2.

Further, the second conductive adhesive 350 that bonds the conductive wiring 200 and the intercell connector 300A may be made of a metal material including tin (Sn) or an alloy including tin (Sn).

More specifically, the second conductive adhesive 350 may be formed in a solder paste form including tin (Sn) or an alloy including tin (Sn) and may be formed in an epoxy solder paste or conductive paste form including tin (Sn) or an alloy including tin (Sn) in epoxy.

Because a solar cell module having such a structure includes a separate intercell connector 300A, when there is a solar cell in which a connection failure has occurred between the conductive wiring 200 and the first and second electrodes 141 and 142 among a plurality of solar cells, by releasing a connection between the intercell connector 300A and the plurality of conductive wirings 200, only a corresponding solar cell can be more easily replaced.

In the foregoing description, in a solar cell module according to an example embodiment of the present invention, a structure has been described in which the conductive wiring 200 is connected to a rear surface of each of adjacent random first and second solar cells C1 and C2 and in which the first and second solar cells C1 and C2 are connected in series to the intercell connector 300A.

Hereinafter, a detailed structure of a solar cell that may be applied to the first and second solar cells C1 and C2 will be described.

Figure 6:
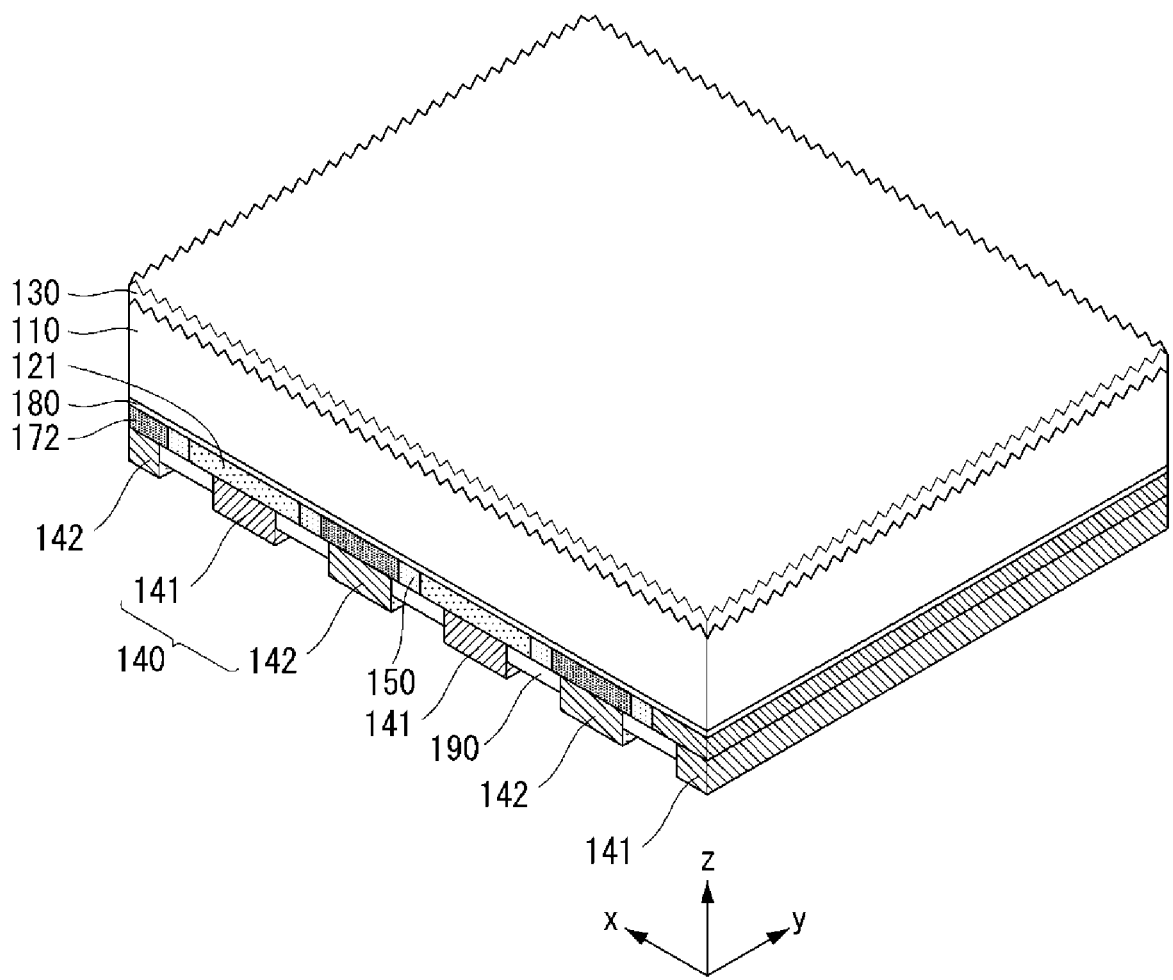
FIGS. 6 to 8 are diagram illustrating a solar cell according to an example embodiment of the present invention.
Figure 7:
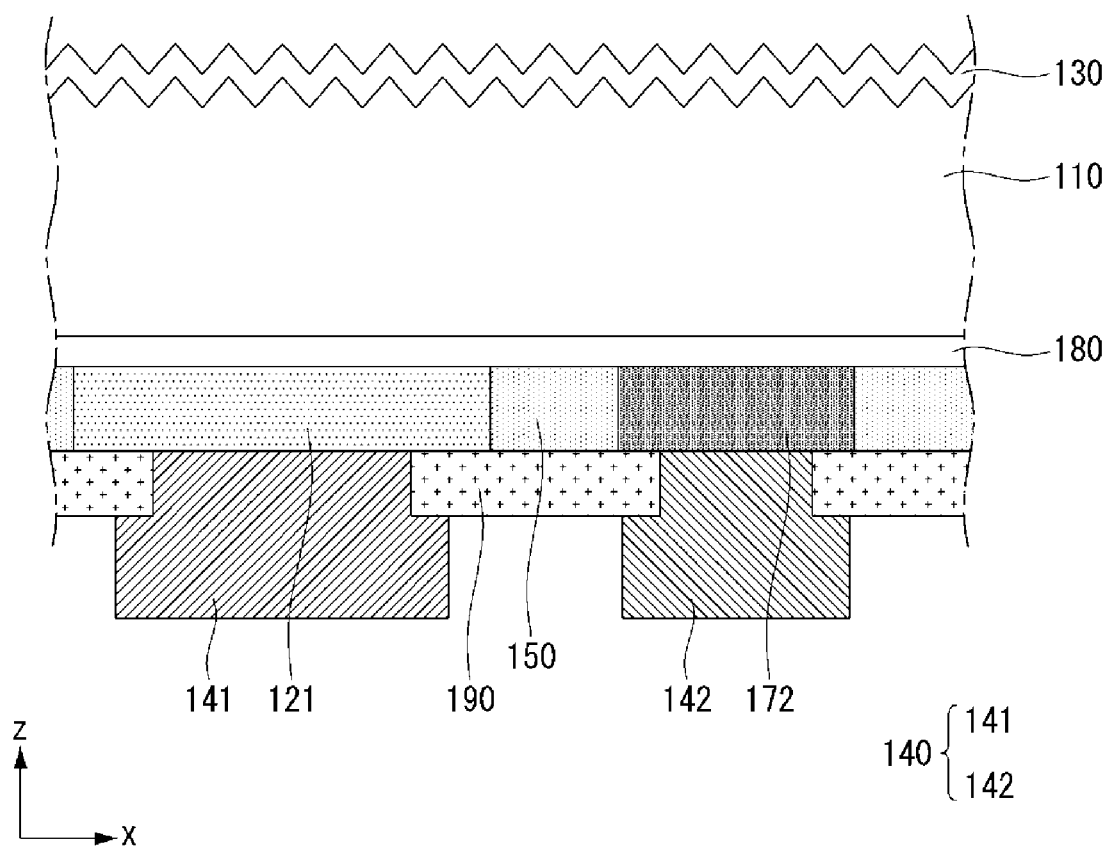
Figure 8:
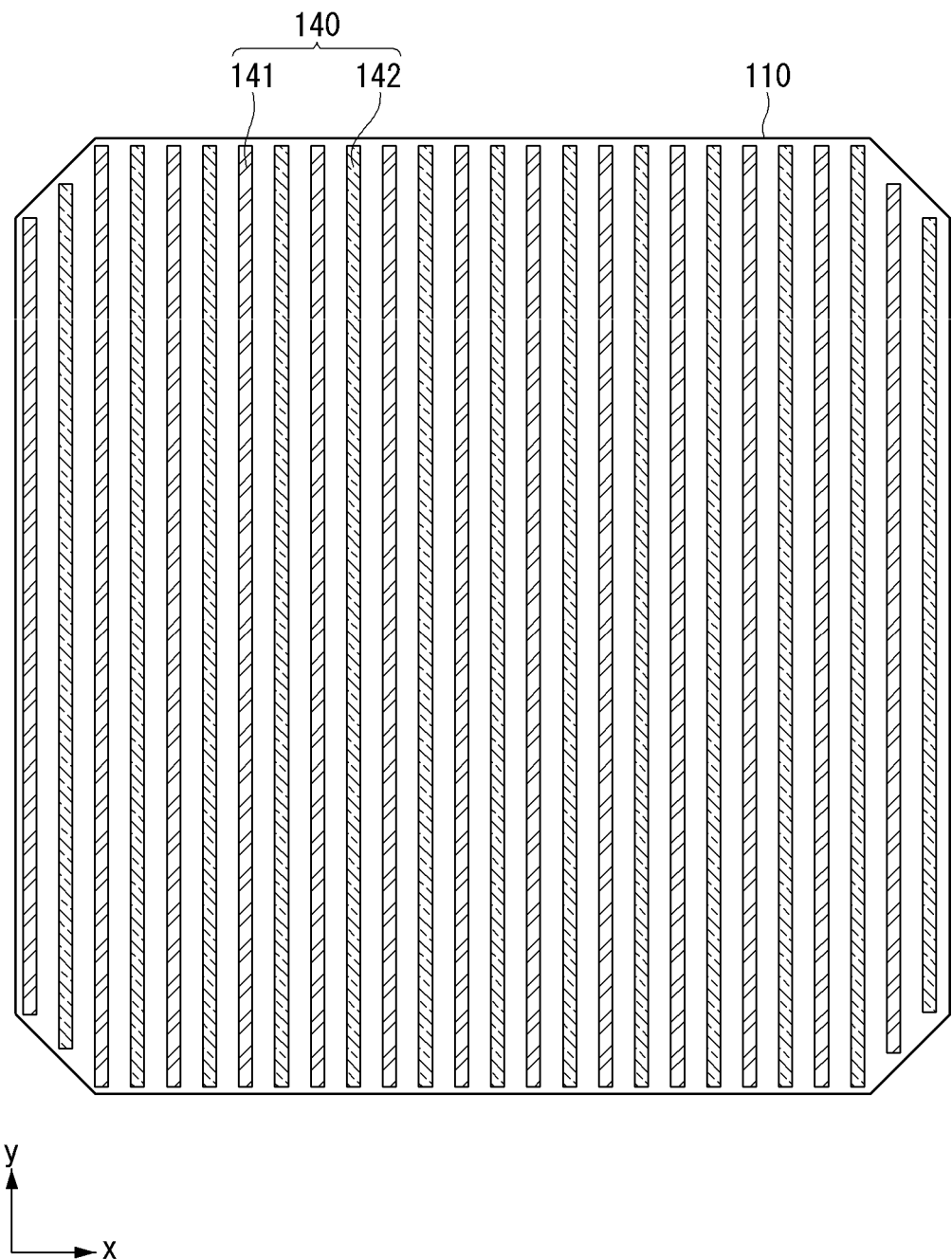

FIGS. 6 to 8 are diagram illustrating a solar cell according to an example embodiment of the present invention, FIG. 6 is a partial perspective view illustrating a solar cell according to an example embodiment of the present invention, FIG. 7 illustrates a cross-section of a first direction x of the solar cell of FIG. 6, and FIG. 8 illustrates a pattern of first and second electrodes 200 formed at a rear surface of a semiconductor substrate.

As shown in FIGS. 6 and 7, a solar cell according to an example embodiment of the present invention may include a reflection prevention layer 130, a semiconductor substrate 110, a tunnel layer 180, a first semiconductor portion 121, a second semiconductor portion 172, an intrinsic semiconductor portion 150, a passivation layer 190, a plurality of first electrodes 141, and a plurality of second electrodes 142.

Here, the reflection prevention layer 130, the tunnel layer 180, and the passivation layer 190 may be omitted, but when the reflection prevention layer 130, the tunnel layer 180, and the passivation layer 190 are provided, efficiency of a solar cell is further enhanced and hereinafter, an instance will be described in which the reflection prevention layer 130, the tunnel layer 180, and the passivation layer 190 are provided.

The semiconductor substrate 110 may be formed with at least one of monocrystal silicon and polycrystal silicon in which first conductive type or second conductive type impurities are doped. For example, the semiconductor substrate 110 may be formed with a monocrystal silicon wafer.

Here, first conductive type impurities or second conductive type impurities contained in the semiconductor substrate 110 may be any one of an n-type or p-type conductive type.

When the semiconductor substrate 110 has a p-type conductive type, trivalent impurities such as boron (B), gallium, and indium may be doped at the semiconductor substrate 110. However, when the semiconductor substrate 110 has an n-type conductive type, pentavalent impurities such as phosphorus (P), arsenic (As), antimony (Sb) may be doped at the semiconductor substrate 110.

Hereinafter, an instance will be exemplified in which impurities contained in the semiconductor substrate 110 are second conductive type impurities and are an n-type. However, the present invention is not always limited thereto.

A front surface of the semiconductor substrate 110 may have a plurality of protrusion and depression surfaces. Thereby, the first semiconductor portion 121 positioned on a front surface of the semiconductor substrate 110 may also have a protrusion and depression surface.

Thereby, as an amount of light reflected from a front surface of the semiconductor substrate 110 reduces, an amount of light applied into the semiconductor substrate 110 may increase.

In order to minimize reflection of light applied from the outside to a front surface of the semiconductor substrate 110, the reflection prevention layer 130 may be positioned on the front surface of the semiconductor substrate 110 and may be formed with at least one of an aluminum oxide film (AlOx), a silicon nitride film (SiNx), a silicon oxide film (SiOx), and a silicon oxinitride film (SiOxNy).

The tunnel layer 180 directly contacts and is disposed at an entire rear surface of the semiconductor substrate 110 and may include a dielectric material. Therefore, as shown in FIGS. 6 and 7, the tunnel layer 180 may pass through carriers generated in the semiconductor substrate 110.

The tunnel layer 180 may pass through carriers generated in the semiconductor substrate 110 and perform a passivation function of a rear surface of the semiconductor substrate 110.

Further, the tunnel layer 180 may be made of a dielectric material formed with SiCx or SiOx having strong durability even in a high temperature process of 600° C. or more.

As shown in FIGS. 6 and 7, the first semiconductor portion 121 may be disposed at a rear surface of the semiconductor substrate 110 and may be disposed, for example, to directly contact a portion of a rear surface of the tunnel layer 180.

Further, the first semiconductor portion 121 may be long disposed in a second direction y at a rear surface of the semiconductor substrate 110 and be made of a polycrystal silicon material having a first conductive type opposite to a second conductive type.

Here, first conductive type impurities may be doped at the first semiconductor portion 121, and when impurities contained in the semiconductor substrate 110 are second conductive type impurities, the first semiconductor portion 121 may form a p-n junction with the semiconductor substrate 110 with the tunnel layer 180 interposed therebetween.

Because each first semiconductor portion 121 forms a p-n junction with the semiconductor substrate 110, the first semiconductor portion 121 may have a p-type conductive type, and when a plurality of first semiconductor portions 121 has a p-type conductive type, trivalent impurities may be doped in the first semiconductor portion 121.

The second semiconductor portion 172 is long extended and disposed in a second direction y parallel to the first semiconductor portion 121 at a rear surface of the semiconductor substrate 110 and may be formed, for example, by direct contact with a partial area separated from each of the first semiconductor portions 121 at a rear surface of the tunnel layer 180.

The second semiconductor portion 172 may be made of a polycrystal silicon material in which second conductive type impurities are doped with a higher concentration than that of the semiconductor substrate 110. Therefore, for example, when the semiconductor substrate 110 is doped with n-type impurities, which are second conductive type impurities, a plurality of second semiconductor portions 172 may be an n+ impurity area.

Such a second semiconductor portion 172 may disturb a hole movement toward the second semiconductor portion 172, which is a moving direction of electrons by a potential barrier due to an impurity concentration difference between the semiconductor substrate 110 and the second semiconductor portion 172, but may easily enable a carrier (e.g., electron) movement toward the second semiconductor portion 172.

Therefore, in the second semiconductor portion 172 and a periphery thereof or the first and second electrodes 141 and 142, by reducing an amount of electric charges lost by recoupling of electrons and holes and by accelerating an electron movement, an amount of an electron movement to the second semiconductor portion 172 may increase.

FIGS. 6 and 7 illustrate an instance in which the semiconductor substrate 110 is second conductive type impurities, wherein the first semiconductor portion 121 performs a function as an emitter portion and the second semiconductor portion 172 performs a function as a rear electric field portion.

Alternatively, when the semiconductor substrate 110 contains first conductive type impurities, the first semiconductor portion 121 may perform a function of a rear electric field portion, and the second semiconductor portion 172 may perform a function of an emitter portion.

Further, FIGS. 6 and 7 illustrate an instance in which the first semiconductor portion 121 and the second semiconductor portion 172 are made of a polycrystal silicon material at a rear surface of the tunnel layer 180.

Alternatively, when the tunnel layer 180 is omitted, the first semiconductor portion 121 and the second semiconductor portion 172 may be doped with diffusion of impurities within a rear surface of the semiconductor substrate 110, and in such an instance, the first semiconductor portion 121 and the second semiconductor portion 172 may be made of the same monocrystal silicon material as that of the semiconductor substrate 110.

As shown in FIGS. 6 and 7, the intrinsic semiconductor portion 150 may be formed at a rear surface of the tunnel layer 180 exposed between the first semiconductor portion 121 and the second semiconductor portion 172, and the intrinsic semiconductor portion 150 may be formed with an intrinsic polycrystal silicon layer in which first conductive type impurities or second conductive type impurities are not doped unlike the first semiconductor portion 121 and the second semiconductor portion 172.

Further, as shown in FIGS. 6 and 7, each of both side surfaces of the intrinsic semiconductor portion 150 may have a structure that directly contacts a side surface of the first semiconductor portion 121 and a side surface of the second semiconductor portion 172.

By removing a defect by a dangling bond formed at a rear surface of a polycrystal silicon material layer formed in the first semiconductor portion 121, the second semiconductor portion 172, and the intrinsic semiconductor portion 150, the passivation layer 190 may perform a function of preventing carriers generated from the semiconductor substrate 110 from being dissipated by recoupling by the dangling bond.

As shown in FIG. 8, a plurality of first electrodes 141 may be connected to the first semiconductor portion 121 and be long extended in a second direction y. The first electrode 141 may collect carriers, for example, holes moving toward the first semiconductor portion 121.

A plurality of second electrodes 142 may be connected to the second semiconductor portion 172 and be long extended in a second direction y parallel to the first electrode 141. The second electrode 142 may collect carriers, for example, electrons moved toward the second semiconductor portion 172.

The first electrode 141 and the second electrode 142 may be long formed in a second direction y and be separated in a first direction x. Further, as shown in FIG. 8, the first electrode 141 and the second electrode 142 may be alternately disposed in a first direction x.

In a solar cell according to an example embodiment of the present invention produced in such a structure, holes collected through the first electrode 141 and electrons collected through the second electrode 142 may be used as power of an external device through an external circuit device.

A solar cell applied to a solar cell module according to an example embodiment of the present invention is not always limited to FIGS. 6 and 7 and other constituent elements may be changed except that the first and second electrodes 141 and 142 provided in the solar cell are formed at only a rear surface of the semiconductor substrate 110.

For example, in a solar cell module of the present invention, a portion of the first electrode 141 and the first semiconductor portion 121 are positioned at a front surface of the semiconductor substrate 110, and a portion of the first electrode 141 may be applied to an MWT type solar cell connected to the remaining portions of the first electrode 141 formed at a rear surface of the semiconductor substrate 110 through a hole formed in the semiconductor substrate 110.

In such a solar cell module, because the intercell connector 300 is separately disposed from each solar cell between two adjacent solar cells and is in a state connected by the conductive wiring 200 of each solar cell, in a production process, when a defect is found in any one solar cell, only the solar cell in which a defect is found can be more easily replaced without damage of a solar cell adjacent to the solar cell in which a defect is found.

Hereinafter, a method of manufacturing a solar cell module that replaces only a solar cell in which a defect is found in a module production process will be described in detail.

Hereinafter, a solar cell in which a defect is found is defined to a target solar cell, and a string including the target solar cell is defined to a target string.

For example, FIG. 1 illustrates an instance in which a target solar cell TC having a defect is included in the third string ST3 and in which the third string ST3 is designated as a target string.

Figure 9:
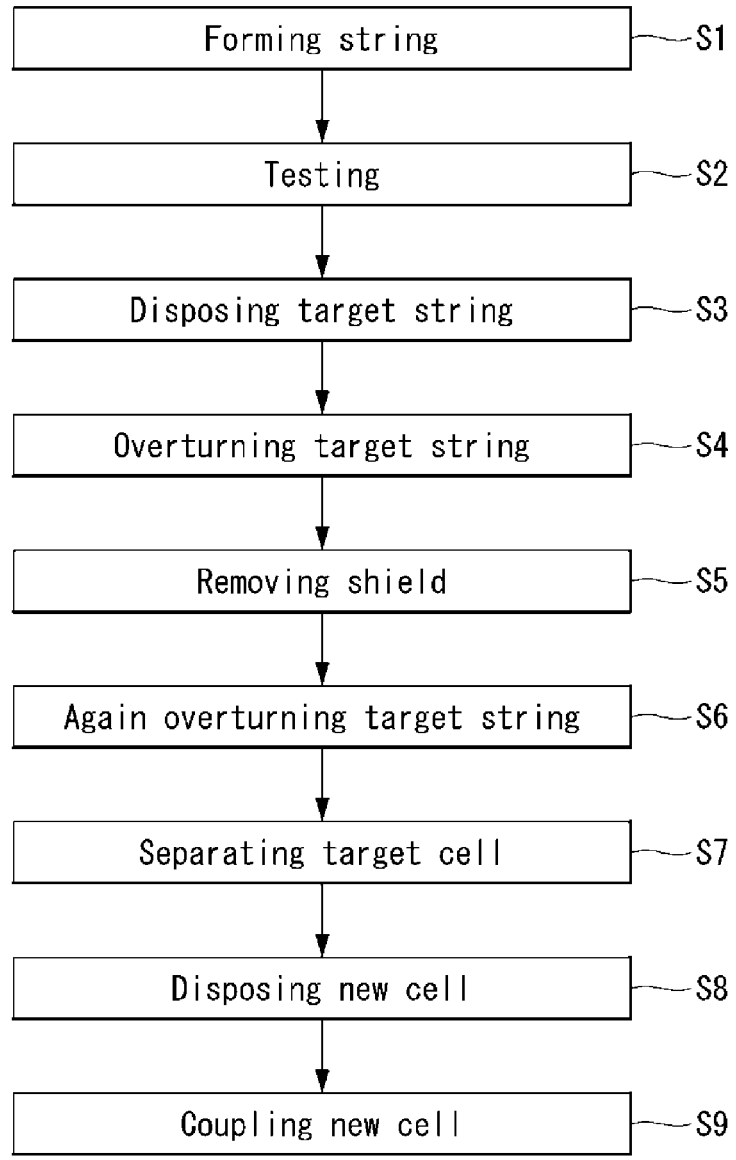
FIG. 9 is a flowchart illustrating a method of manufacturing a solar cell module according to an example embodiment of the present invention.
Figure 10:
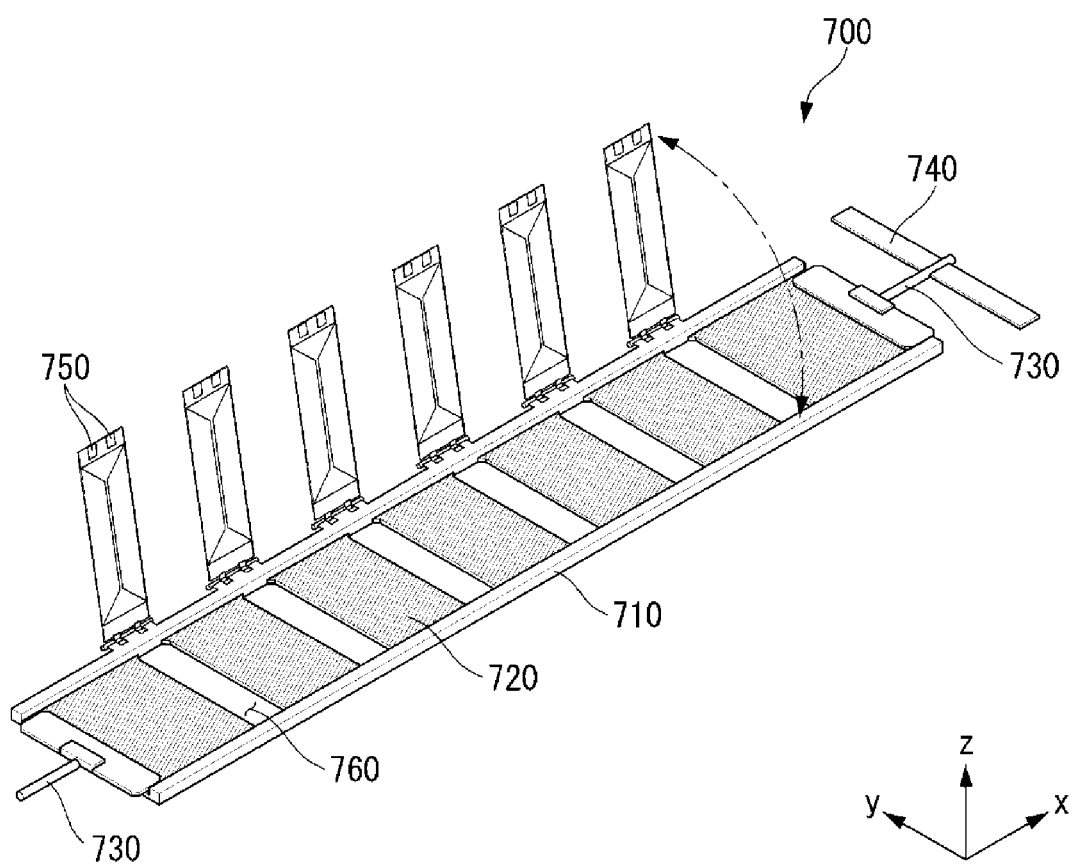
FIG. 10 is a diagram illustrating an example of a repair device to be used when replacing a target solar cell in a solar cell module production process according to an example embodiment of the present invention.
Figure 11:
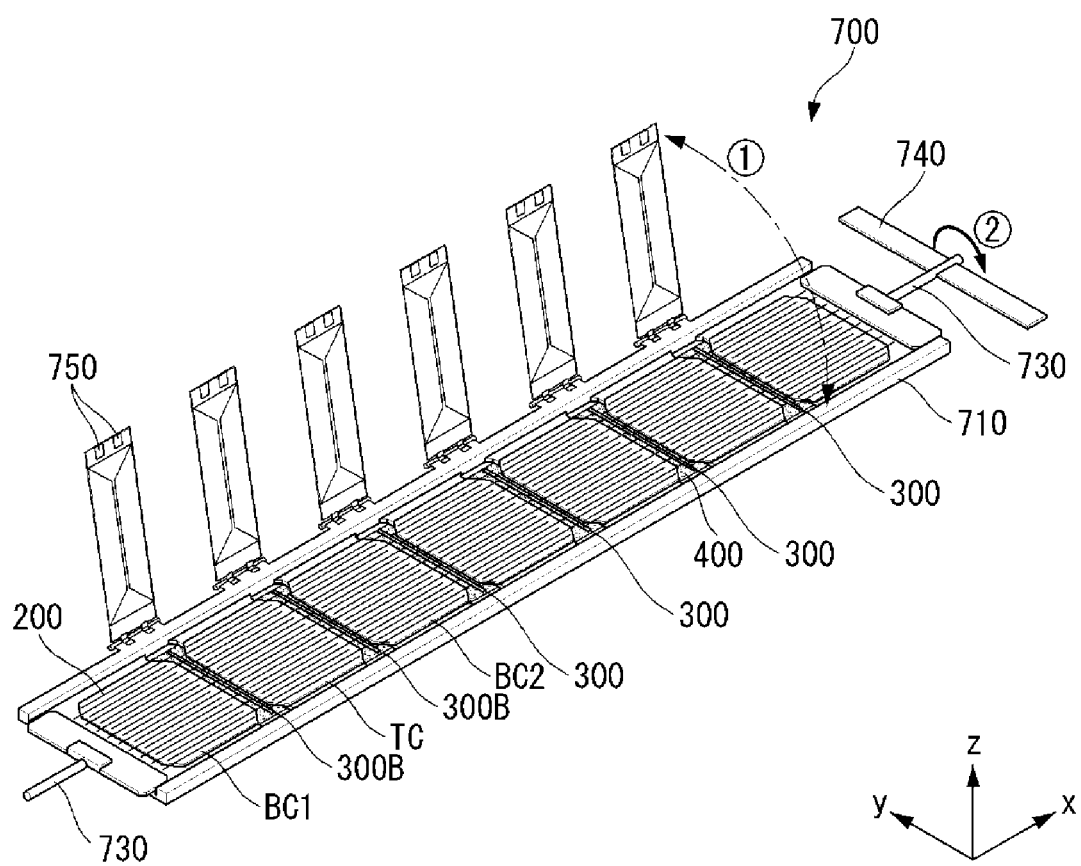
FIG. 11 is a diagram illustrating an example in which a target string is disposed in the repair device of FIG. 10.
Figure 12:
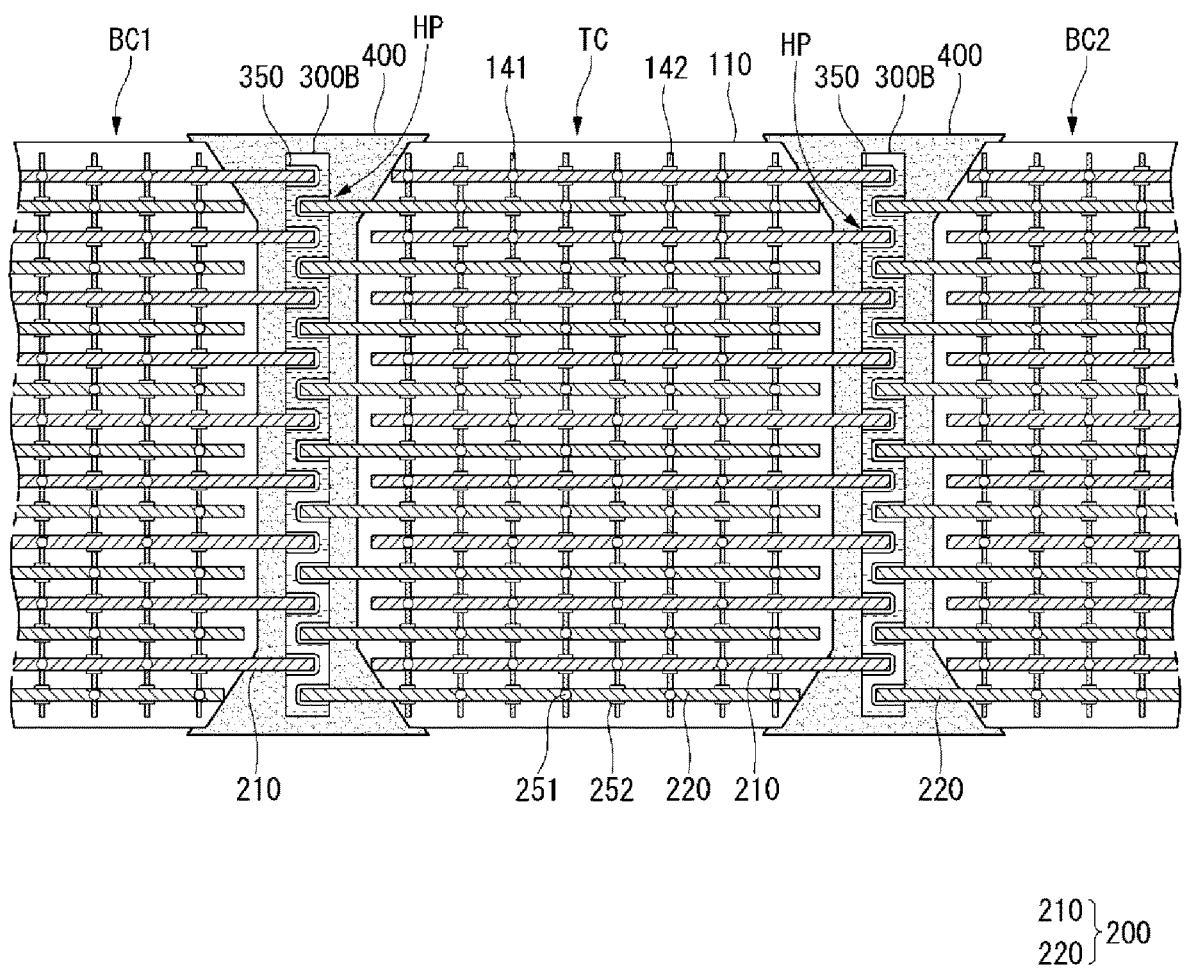
FIG. 12 is an enlarged view of a portion in which a target solar cell is positioned in a target string according to an example embodiment of the present invention.

FIG. 9 is a flowchart illustrating a method of manufacturing a solar cell module according to an example embodiment of the present invention, FIG. 10 is a diagram illustrating an example of a repair device 700 to be used when replacing a target solar cell TC in a solar cell module production process, FIG. 11 is a diagram illustrating an example in which a target string is disposed at the repair device 700 of FIG. 10, and FIG. 12 is an enlarged view of a portion in which a target solar cell TC is positioned at a target string.

Figure 13:
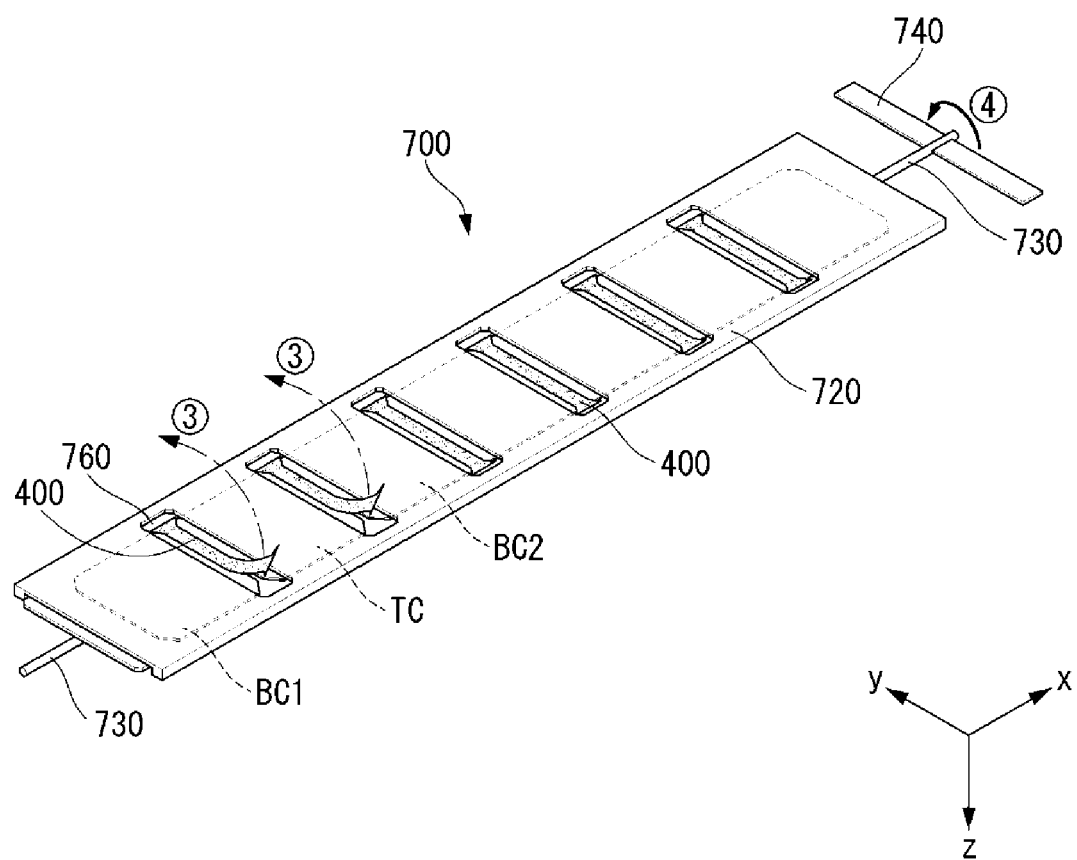
FIG. 13 is a diagram illustrating an overturned state of a body frame of a repair device in a state in which a fixing portion is locked to fix a target string to the repair device in FIG. 11.
Figure 14:
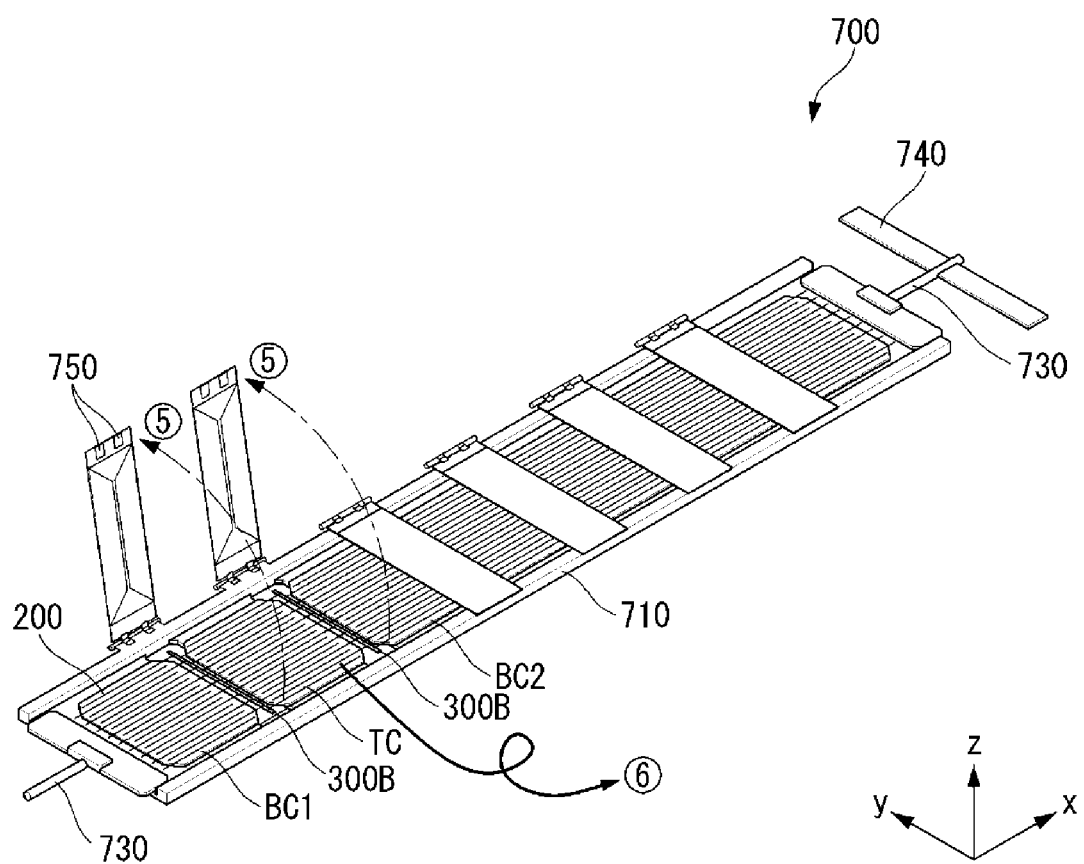
FIG. 14 is a diagram illustrating an opened state of only a fixing portion overlapped with an intercell connector positioned at both side surfaces of a target solar cell in a state in which the body frame of the repair device of FIG. 13 is again overturned.
Figure 15:
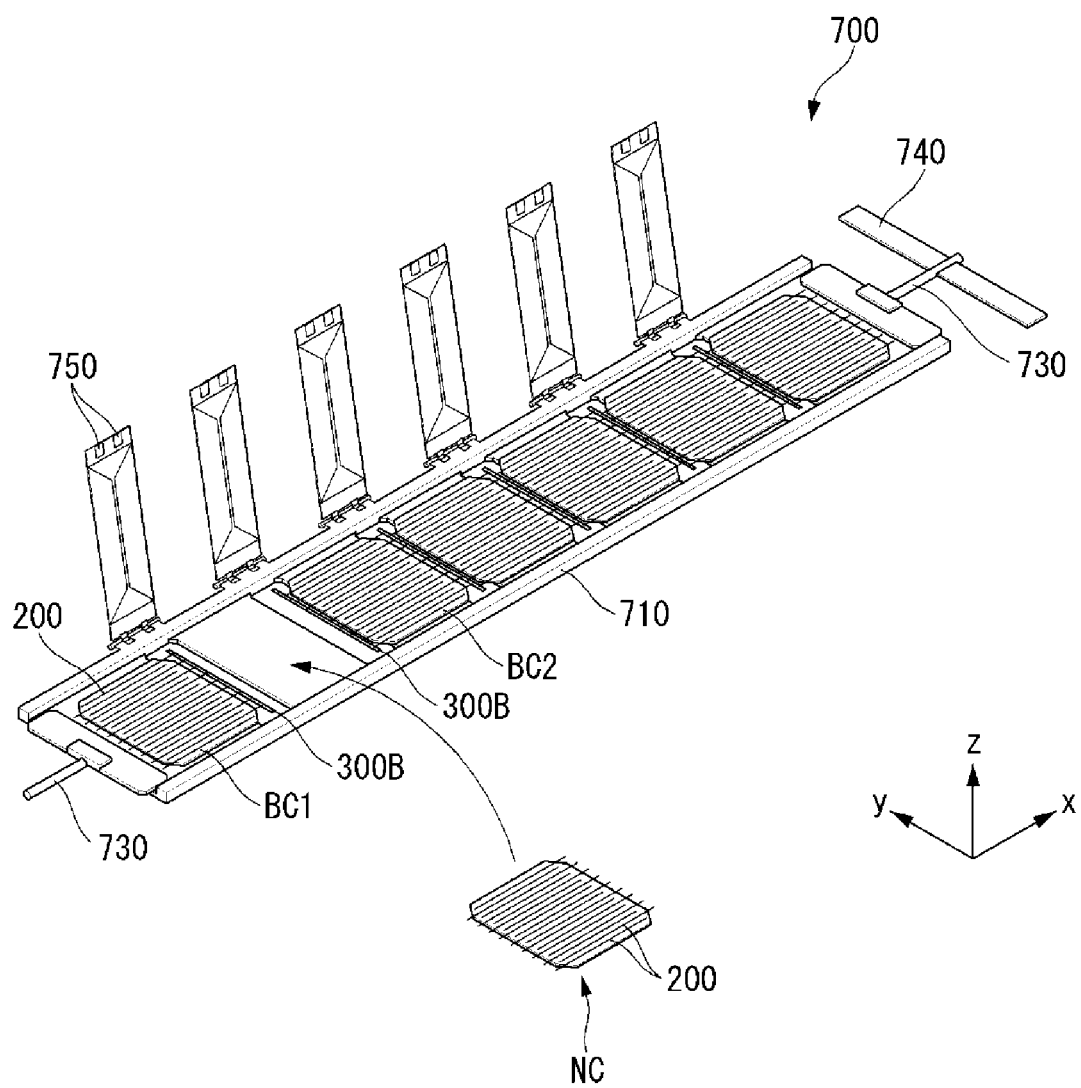
FIG. 15 is a diagram illustrating a state in which a target solar cell is separated from a repair device according to an example embodiment of the present invention.
Figure 16:
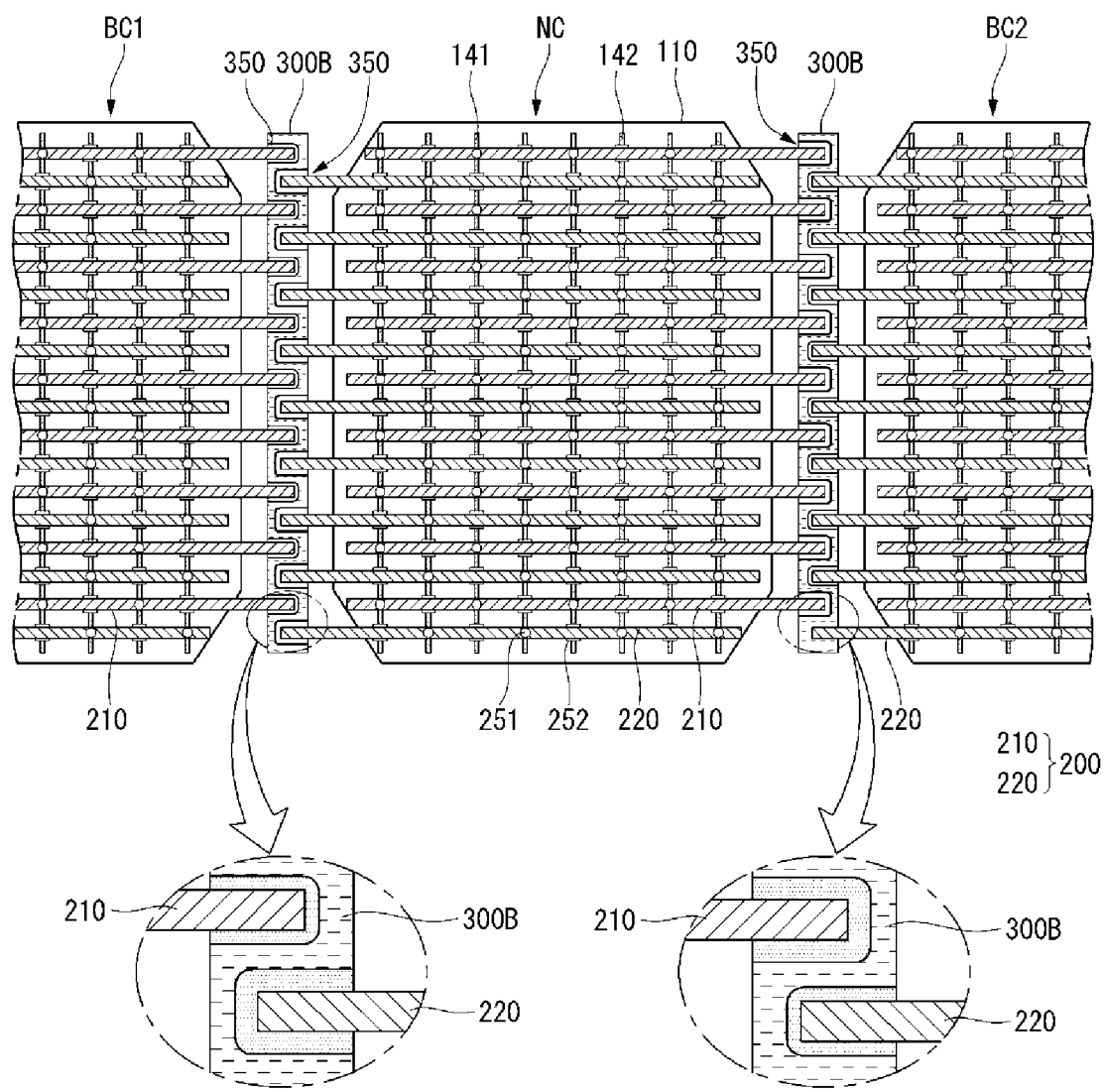
FIG. 16 is a diagram illustrating an example of a state in which a new solar cell is disposed and connected to a target string according to an example embodiment of the present invention.

FIG. 13 is a diagram illustrating an overturned state of a body frame 710 of a repair device 700 in a state in which a fixing portion 750 is locked to fix a target string to the repair device 700 in FIG. 11, FIG. 14 is a diagram illustrating an opened state of only a fixing portion 750 overlapped with an intercell connector 300 positioned at both side surfaces of a target solar cell TC in a state in which the body frame 710 of the repair device 700 of FIG. 13 is again overturned, FIG. 15 is a diagram illustrating a state in which a target solar cell TC is separated from a repair device 700, and FIG. 16 illustrates an example in which a new solar cell NC is disposed and connected to a target string.

As shown in FIG. 9, a method of manufacturing a solar cell according to an example embodiment of the present invention may include step of forming a string (S1), step of testing (S2), step of disposing a target string (S3), step of overturning a target string (S4), step of removing a shield (S5), step of again overturning a target string (S6), step of separating a target cell (S7), step of disposing a new cell (S8), and step of coupling a new cell (S9).

As shown in FIG. 1, when a solar cell module includes a shield 400, step S4 of overturning a target string, step S5 of removing a shield, and step S6 of again overturning a target string are required, and when a solar cell module does not the shield 400, step S4 of overturning a target string, step S5 of removing a shield, and step S6 of again overturning a target string may be omitted.

Therefore, when the solar cell module does not the shield 400, immediately after step S3 of disposing a target string, step S7 of separating a target cell may be performed.

In a method of manufacturing a solar cell according to an example embodiment of the present invention, an instance of including the shield 400 is described as an example.

As shown in FIGS. 3 to 5, at step S1 of forming a string, by commonly connecting the plurality of conductive wirings 200 fixed to a rear surface of each of a plurality of solar cells arranged in a first direction x to a rear surface of the intercell connector 300 disposed between each of a plurality of solar cells, a plurality of strings ST1-ST4 to which a plurality of solar cells are connected may be formed.

More specifically, at step S1 of forming a string, by disposing the intercell connector 300 in a second direction y intersecting a first direction x between each of a plurality of solar cells and by thermally processing the plurality of conductive wirings 200 connected to each of a plurality of solar cells in a state commonly overlapped with the intercell connector 300, each of a plurality of strings ST1-ST4 of FIG. 1 may be formed.

In this instance, the intercell connector 300 and the conductive wiring 200 fixed to each of a plurality of solar cells may be connected by the second conductive adhesive 350.

Further, at step S1 of forming a string, the conductive wiring 200 is fixed to the solar cell, but may be in a state that is not yet electrically connected to the solar cell.

That is, the conductive wiring 200 and the solar cell may be electrically connected at lamination step. However, the present invention is not always thereto and before step S1 of forming a string, the conductive wiring 200 and the solar cell may be in an electrically connected state.

In this way, at step S1 of forming a string, after the string is formed, the shield 400 may be attached to a front surface of the intercell connector 300, as shown FIGS. 1 to 5.

In this way, after the shield 400 is attached to each string, each string may be disposed on the front transparent substrate 10 in which the filler sheet 20 is disposed. In this instance, a front surface of each string may be disposed to face the front transparent substrate 10.

Accordingly, as shown in FIG. 1, a plurality of strings ST1-ST4 each may be disposed on the front transparent substrate 10.

In this way, as shown in FIG. 1, in a state in which a plurality of strings ST1-ST4 are disposed on the front transparent substrate 10, the test step S2 may be performed.

In the present invention, in a state in which a plurality of strings ST1-ST4 are disposed on the front transparent substrate 10, an instance in which the test step S2 is performed is described as an example, but the present invention is not always limited thereto and the test step S2 may be performed in a string state before a plurality of strings ST1-ST4 are disposed on the front transparent substrate 10.

At such a test step S2, by testing a defect of each of a plurality of solar cells included in each of a plurality of strings ST1-ST4, a target solar cell TC having a defect among the plurality of strings ST1-ST4 may be found.

At such a test step S2, when each solar cell and the conductive wiring 200 are not electrically connected, a Photoluminescence (PL) test that may determine a failure of a semiconductor substrate of each solar cell may be performed.

However, when the solar cell and the conductive wiring 200 are electrically connected, at test step S2, an Electro luminance (EL) test that may determine an electrical connection relation of the electrode and the conductive wiring 200 as well as the foregoing PL test may be together performed.

At such a test step S2, by determining a failure of a semiconductor substrate, the target solar cell TC may be found from a plurality of solar cells included in each of the plurality of strings ST1-ST4.

In this way, at the test step S2, after the target solar cell TC is found, step S3 of disposing a target string (e.g., ST3 of FIG. 1) including the target solar cell TC at the repair device 700 may be performed.

As shown in FIG. 10, the repair device 700 may include a body frame 710, a support portion 720, a rotation shaft 730, a rotation bar 740, and a fixing portion 750.

The body frame 710 may provide a space that disposes the target string ST3 therein, and at a bottom surface of the body frame 710, the support portion 720 that supports each solar cell included in the target string ST3 may be provided.

The support portion 720 may have an opening hole 760, and the opening hole 760 may be positioned at a portion overlapped with a position of the shield 400 and the intercell connector 300 disposed between two adjacent solar cells.

Therefore, when the target string ST3 is disposed at the body frame 710, a plurality of shields 400 positioned at a front surface of the target string ST3 may be exposed through the opening hole 760 of the support portion 720 positioned at a bottom surface of the body frame 710.

The fixing portion 750 may perform a function of fixing the target string ST3 disposed at the body frame 710. Therefore, as shown in FIG. 10, when the fixing portion 750 covers the body frame 710, the fixing portion 750 may be positioned at an overlapped portion of a plurality of intercell connectors 300 provided in the target string ST3 and an end portion of a first direction x of each solar cell.

The rotation shaft 730 may perform a function of rotating the body frame 710, and when rotating the rotation bar 740 connected to the rotation shaft 730, the body frame 710 may be rotated to perform a function of rotating the target string ST3 disposed within the body frame 710.

In the repair device 700, the target string ST3 including the target solar cell TC may be disposed, as shown in FIG. 11.

In this instance, the target string ST3 disposed within the body frame 710 of the repair device 700 may be disposed such that a rear surface thereof faces upward.

In this way, at the target string ST3 disposed at the repair device 700, as shown in FIG. 12, the plurality of conductive wirings 200 fixed to the solar cell adjacent to the target solar cell TC may be in a state commonly connected to the target intercell connector 300B to which the plurality of conductive wirings 200 fixed to the target solar cell TC are connected.

Here, the target intercell connector 300B means an intercell connector to which the plurality of conductive wirings 200 fixed to the target solar cell TC is connected among a plurality of intercell connectors 300 provided in the target string ST3.

Therefore, the target intercell connector 300B may mean two intercell connectors disposed at both side surfaces of the target solar cell TC among a plurality of intercell connectors 300.

In this way, in a state in which the target string ST3 is disposed at the repair device 700, the fixing portion 750 rotates in a direction of the body frame 710 as indicated by an arrow ① to be closed and to fix the target string ST3.

After step S3 of disposing the target string ST3, the rotation bar 740 rotates in a direction ② and step S4 in which the rotation bar 740 overturns a target string together with the body frame 710 of the repair device 700 may be performed.

By step S4 of overturning a target string, as shown in FIG. 13, the repair device 700 may overturn the target string ST3 such that a front surface of the target string ST3 faces upward.

In this instance, a plurality of shields 400 that have been attached to the target string ST3 may be exposed through a plurality of holes 760 provided in the support portion 720 of the repair device 700.

Thereafter, at step S5 of removing a shield, among a plurality of shields 400 attached to the target string ST3, only the shield 400 positioned at a front surface of the target intercell connector 300B may be removed.

That is, among a plurality of shields 400 attached to the target string ST3, as indicated by an arrow ③, two shields 400 positioned between solar cells adjacent to both side surfaces of the target solar cell TC may be removed. Accordingly, as shown in FIG. 12, only the shield 400 disposed at both side surfaces of the target solar cell TC may be removed.

Thereafter, by rotating the rotation bar 740 as indicated by an arrow ④, step S6 of again overturning the target string ST3 may be performed.

In this way, by step S6 of again overturning the target string ST3, a rear surface of the target string ST3 may be disposed to again face upward.

Thereafter, in a state in which only the fixing portion 750 overlapped with the target intercell connector 300B is opened as indicated by an arrow ⑤, step S7 of separating a target cell may be performed.

At step S7 of separating a target cell, in the target string ST3, by selectively thermally processing a connection area of the target intercell connector 300B and the plurality of conductive wirings 200 fixed to the target solar cell TC, the target solar cell TC may be separated from the target string ST3.

In order to separate the target solar cell TC from the target string ST3, at step S7 of separating a target cell, as shown in FIG. 12, a connection area HP of the target intercell connector 300B and the plurality of conductive wirings 200 fixed to the target solar cell TC may be selectively thermally processed.

At step S7 of separating a target cell, a thermal processing temperature may be 200° C.-1500° C.

Further, at step S7 of separating a target cell, in a connection area of the target intercell connector 300B and the plurality of conductive wirings 200 fixed to solar cells BC1 and BC2 adjacent to the target solar cell TC, a thermal processing may not be performed.

Accordingly, in a state in which the target intercell connector 300B positioned at both side surfaces of the target solar cell TC is fixed to the conductive wiring 200 of adjacent normal solar cells BC1 and BC2, only the conductive wiring 200 of the target solar cell TC is separated from the target intercell connector 300B and thus as indicated by an arrow ⑥ of FIG. 14, only the target solar cell TC may be separated from the target string ST3.

Thereafter, step S8 of disposing a new cell may be performed.

For step S8 of disposing a new cell, the plurality of conductive wirings 200 are fixed to a rear surface of the new solar cell (NC), and at step S8 of disposing a new cell, by disposing the plurality of conductive wirings 200 fixed to the new solar cell NC to overlap with the target intercell connector 300B, as shown in FIG. 16, the new solar cell NC may be disposed at the target string ST3.

In a state in which the plurality of conductive wirings 200 fixed to the new solar cell NC are disposed to be overlapped with the target intercell connector 300B, step S9 of coupling a new cell may be performed.

At step S9 of coupling a new cell, by selectively thermally processing an overlapped area of the target intercell connector 300B and the plurality of conductive wirings 200 fixed to the new solar cell NC, the plurality of conductive wirings 200 fixed to the new solar cell NC may be connected to the target intercell connector 300B.

At step S9 of coupling a new cell, a thermal processing may be performed between the target intercell connector 300B and the plurality of conductive wirings 200 fixed to the new solar cell NC.

In this instance, by selectively thermally processing only an overlapped portion of the target intercell connector 300B and the plurality of conductive wirings 200 fixed to the new solar cell NC, the new solar cell NC may be connected to the target string ST3.

Therefore, a thermal processing may not be performed between the target intercell connector 300B and the conductive wiring 200 of adjacent normal solar cells BC1 and BC2.

At step S9 of coupling a new cell, a thermal processing temperature may be higher than a thermal processing temperature of a lamination process. For example, a thermal processing temperature of a lamination process may have a value between 160° C.-170° C., and at step S9 of coupling a new cell, a thermal processing temperature may have a value between 200° C.-1500° C.

Further, when only an overlapped portion of the target intercell connector 300B and the plurality of conductive wirings 200 fixed to the new solar cell NC is selectively thermally processed, the second conductive adhesive 350 may be additionally supplied between the target intercell connector 300B and the plurality of conductive wirings 200 fixed to the new solar cell NC.

Accordingly, after step S9 of coupling a new cell, on the target intercell connector 300B, a coating area of the second conductive adhesive 350 that bonds the plurality of conductive wirings 200 of the new solar cell NC may be formed larger than that of the second conductive adhesive 350 that bonds the plurality of conductive wirings 200 fixed to adjacent normal solar cells BC1 and BC2.

Thereafter, the shield 400 is again attached to a front surface of the target string ST3 to which the new solar cell NC is connected, and after the target string ST3 connected to the new solar cell NC is again disposed on the front transparent substrate 10, by performing a lamination step, a solar cell module may be complete.

Therefore, after the lamination step is performed, when the solar cell module is complete, by determining a coating area of the second conductive adhesive 350 formed in the intercell connector 300, a replaced solar cell among a plurality of solar cells may be distinguished.

For example, when any one solar cell is replaced from the target solar cell TC to the new solar cell NC, in the target intercell connector 300B positioned at both side surfaces of the any one solar cell replaced with the new solar cell NC, a coating area of the second conductive adhesive 350 may be different.

That is, the plurality of conductive wirings 200 connected to the solar cells BC1 and BC2 adjacent to both sides of the new solar cell NC and the plurality of conductive wirings 200 connected to any one solar cell replaced with the new solar cell NC may be commonly connected to the target intercell connector 300B.

Further, on the target intercell connector 300B, a coating area of each of the second conductive adhesives 350 that connect the plurality of conductive wirings 200 connected to the new solar cell NC to the target intercell connector 300B may be larger than that of the second conductive adhesives 350 that connect the plurality of conductive wirings 200 connected to adjacent solar cells BC1 and BC2 to the target intercell connector 300B, as shown in FIG. 16.

More specifically, in the target intercell connector 300B of FIG. 16, a coating area of the second conductive adhesive 350 positioned between the target intercell connector 300B and the plurality of conductive wirings 200 connected to the new solar cell NC may be larger than that of the second conductive adhesive 350 positioned between the target intercell connector 300B and the plurality of conductive wirings 200 connected to adjacent normal solar cells BC1 and BC2.

Further, in the remaining intercell connectors 300, except for the target intercell connector 300B among a plurality of intercell connectors 300, a coating area of each of the second conductive adhesive 350 that connect the plurality of conductive wirings 200 connected to a solar cell adjacent to one side surface of the remaining intercell connectors 300 to the remaining intercell connectors 300 may be the same as that of each of the second conductive adhesives 350 that connect the plurality of conductive wirings 200 connected to a solar cell adjacent to the other side surface of the remaining intercell connectors 300 to the remaining intercell connectors 300.

That is, when the remaining intercell connectors 300, except for the target intercell connector 300B is the intercell connector 300B positioned between first and second solar cells C1 and C2, as shown in FIG. 4, a coating area of each of the second conductive adhesives 350 between the intercell connector 300 and the first conductive wiring 200 connected to the first solar cell C1 may be the same as that of each of the second conductive adhesives 350 between the intercell connector 300 and the second conductive wiring 200 connected to the second solar cell C2.

Further, in the target intercell connector 300B of FIG. 16, a coating area of the second conductive adhesive 350 positioned between the target intercell connector 300B and the plurality of conductive wirings 200 connected to any one solar cell replaced with the new solar cell NC may be larger than that of the second conductive adhesive 350 positioned between the intercell connector 300 between the first and second solar cells C1 and C2 and the conductive wiring 200 connected to the first and second solar cells C1 and C2 of FIG. 4.

In the foregoing description, after the target solar cell TC is replaced with the new solar cell NC, an instance has been described in which the intercell connector 300 adjacent thereto is replaced. In another example, after the new solar cell NC is coupled, step of attaching a fixing member (310 of FIG. 17) that fixes the intercell connector 300 on the intercell connector 300 may be further included. Accordingly, the intercell connector 300 connected to the new solar cell NC may be more stably fixed. In this instance, after the intercell connector 300 and the shield 400 are attached, the fixing member 310 may be fixed, and after the intercell connector 300 is fixed, before attaching the shield 400, the fixing member 310 may be fixed. However, the present invention is not limited thereto and the fixing member 310 may fix various wiring materials 200 and 300 at an outer edge of the solar cell C. The fixing member 310 may be positioned at a solar cell panel by another manufacturing apparatus or manufacturing method instead of the foregoing manufacturing apparatus or manufacturing method.

Hereinafter, a solar cell module and a method of manufacturing the same according to other example embodiments of the present invention and modified examples thereof including the fixing member 310 that may be attached on the intercell connector 300 will be described in detail. A detailed description of the same portion as or a portion very similar to the foregoing description is omitted and only dissimilar portions will be described in detail. A combination of the foregoing example embodiment or modified examples thereof and the following example embodiment or modified examples thereof belongs to the scope of the present invention.

Figure 17:
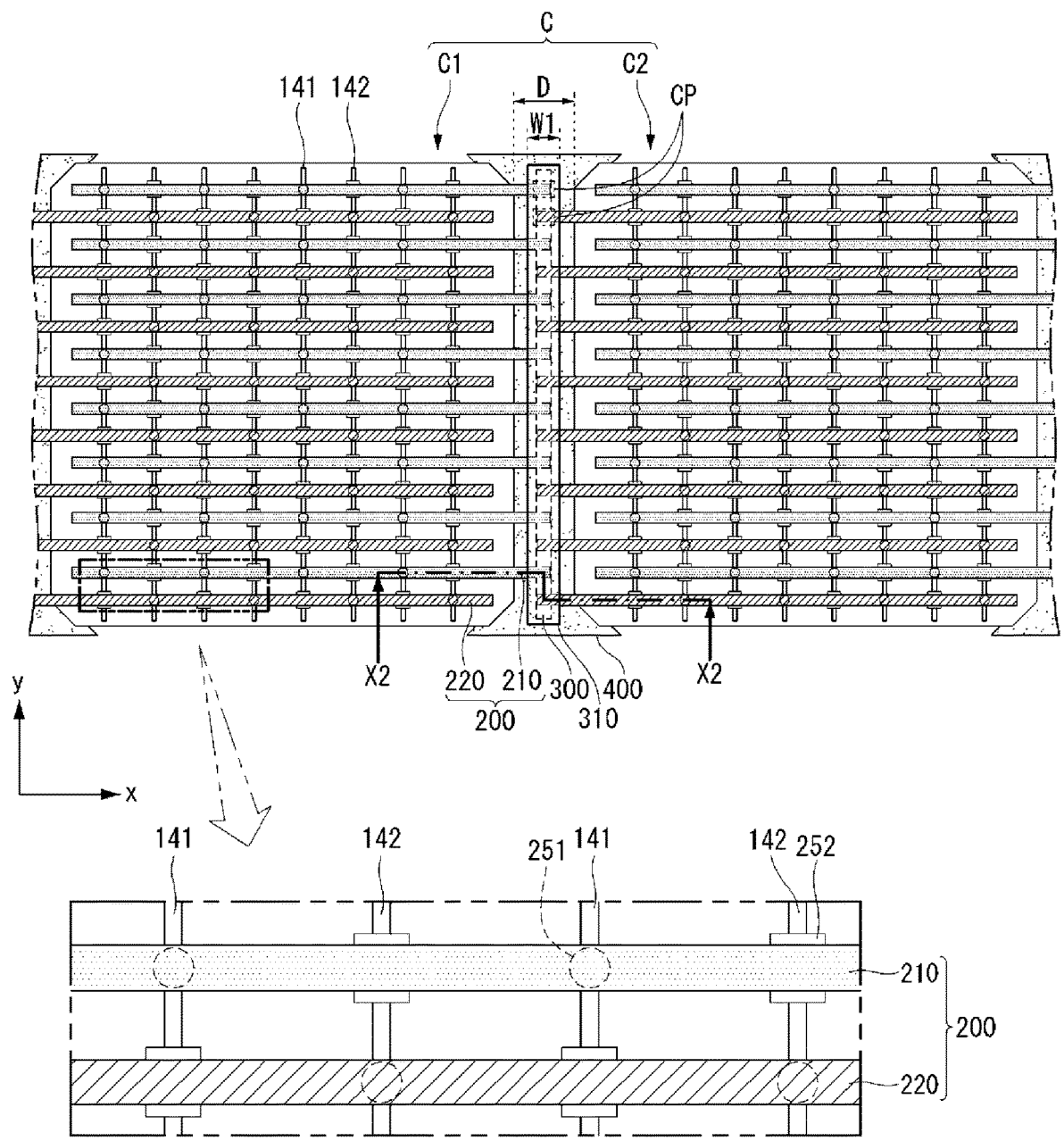
FIG. 17 is a rear plan view illustrating two solar cells, a conductive wiring, an intercell connector, an insulating layer, a first conductive adhesive, and a shield included in a solar cell module according to another example embodiment of the present invention.
Figure 18:
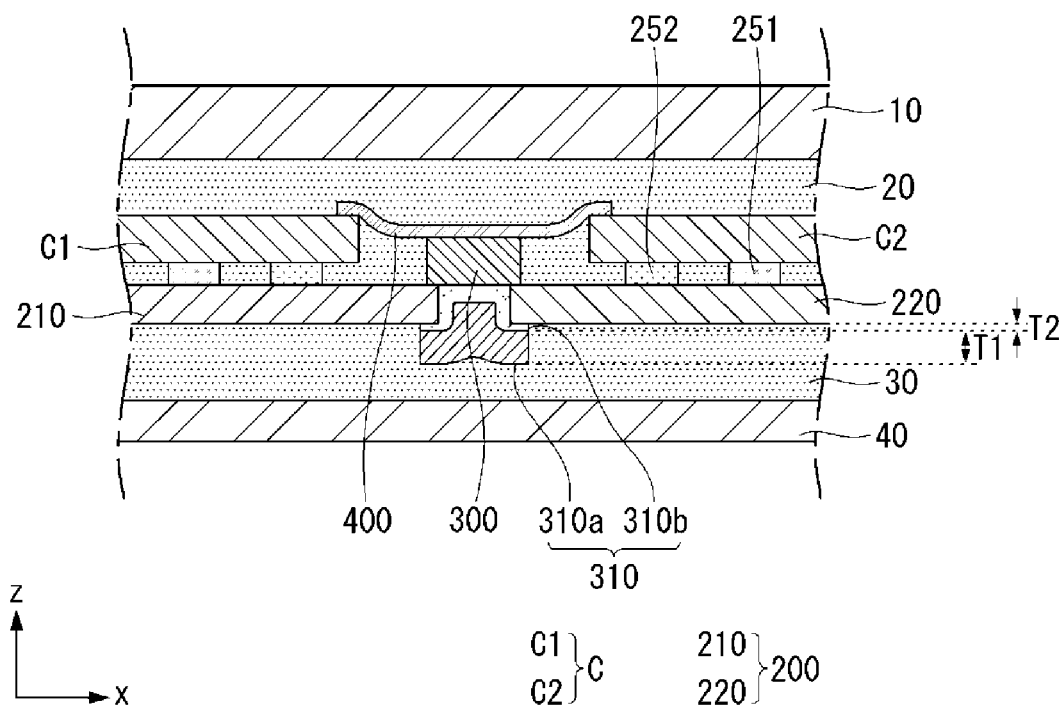
FIG. 18 is a cross-sectional view taken along line X2-X2 of FIG. 17.

FIG. 17 is a rear plan view illustrating two solar cells C1 and C2, a conductive wiring 200, an intercell connector 300, an insulating layer 252, a first conductive adhesive 251, and a shield 400 included in a solar cell module according to another example embodiment of the present invention. FIG. 18 is a cross-sectional view taken along line X2-X2 of FIG. 17.

Referring to FIGS. 17 and 18, in the present example embodiment, the solar cell module includes a portion positioned in at least an outer edge of the solar cell C and includes a fixing member 310 that fixes the wiring portions 200 and 300 positioned at an outer edge of the solar cell C.

For example, the fixing member 310 may be formed while covering a connecting portion CP of the conductive wiring 200 and the intercell connector 300 (or the conductive wiring 200 and busbar wiring).

For example, in the present example embodiment, while the fixing member 310 is positioned at least between the first solar cell C1 and the second solar cell C2, the fixing member 310 may fix the wiring portions 200 and 300 positioned therebetween. That is, the fixing member 310 may fix the intercell connector 300 and the first and second conductive wirings 210 and 220 positioned between the first solar cell C1 and the second solar cell C2. Therefore, in a state in which the intercell connector 300 is connected to the first and second conductive wirings 210 and 220, by fixing the fixing member 310 to the first and second conductive wirings 210 and 220 and the intercell connector 300, the first and second conductive wirings 210 and 220 and the intercell connector 300 may be more stably fixed.

For example, the intercell connector 300 is positioned at one surface (e.g., a front surface) of the first and second conductive wirings 210 and 220, and while the fixing member 310 is positioned toward the other surface (e.g., a rear surface) of the first and second conductive wirings 210 and 220, the fixing member 310 may be fixed to the first and second conductive wirings 210 and 220 and the intercell connector 300. Therefore, the first and second conductive wirings 210 and 220 may be connected and fixed by the intercell connector 300 at one surface and may be connected and fixed by the fixing member 310 at the other surface. Thereby, connection and fixing of the first and second conductive wirings 210 and 220 and the intercell connector 300 may be more securely maintained and the fixing member 310 may be easily attached.

In an environment in which the solar cell module is positioned, when a temperature is changed, expansion and contraction of the conductive wiring 200 (i.e., the first and second conductive wirings 210 and 220) is repeated. In this instance, by expansion and contraction of the conductive wiring 200, a problem may occur that the conductive wiring 200 and the intercell connector 300 are separated or that the conductive wiring 200 or the intercell connector 300 is damaged or torn. When such a problem occurs, the solar cell module may be determined to a failure and an output thereof may be deteriorated. Particularly, as in the present example embodiment, in a structure in which the first and second electrodes 141 and 142 and the conductive wiring 200 are positioned at only one surface of the solar cell C, a problem by expansion and contraction of the conductive wiring 200 may become more serious.

In the present example embodiment, by the fixing member 310 connected and fixed to at least one of the first and second conductive wirings 210 and 220 and the intercell connector 300, fixing stability of the first and second conductive wirings 210 and 220 and the intercell connector 300 can be enhanced and strength thereof can be reinforced. Thereby, a problem can be prevented that the intercell connector 300 is separated from the first and second conductive wirings 210 and 220 or that the intercell connector 300 or the first and second conductive wirings 210 and 220 are damaged by expansion and contraction of the first and second conductive wirings 210 and 220. Further, by enclosing the connecting portion CP of the intercell connector 300 and the first and second conductive wirings 210 and 220 with the fixing member 310, at a surface in which the fixing member 310 is positioned, a connecting portion CP of the fillers 20 and 30 and the intercell connector 300 and the first and second conductive wirings 210 and 220 may be separately positioned with the fixing member 310 interposed therebetween. Accordingly, in the connecting portion CP of the intercell connector 300 and the first and second conductive wirings 210 and 220, the fillers 20 and 30 do not penetrate the intercell connector 300 and the first and second conductive wirings 210 and 220 and thus fixing stability of the intercell connector 300 and the first and second conductive wirings 210 and 220 can be further enhanced. Therefore, output deterioration and a failure of the solar cell module can be prevented and long term reliability can be enhanced.

Here, a width W1 of the fixing member 310 may be larger than that of a connecting portion CP in which at least one of the first and second conductive wirings 210 and 220 and the intercell connector 300 are connected by overlapping and may be equal to or larger than that of the intercell connector 300. Accordingly, the fixing member 310 may be formed to be stably overlapped with an entire connecting portion CP in which the first and second conductive wirings 210 and 220 and the intercell connector 300 are connected by overlapping. By such a shape, an effect by the fixing member 310 can be maximized. FIG. 17 illustrates that one fixing member 310 is positioned to entirely overlap with the connecting portion CP of the first and second conductive wirings 210 and 220 and the intercell connector 300. However, the present invention is not limited thereto. Another example thereof will be described in detail hereinafter with reference to FIG. 24.

When producing a cell string, such a fixing member 310 may be fixed on the wiring portions 200 and 300. In this instance, the fixing member 310 may be positioned at an entire space between a plurality of solar cells C and at a space between some solar cells C of the plurality of solar cells C. After the first and second conductive wirings 210 and 220 and the intercell connector 300 are connected and fixed, when the fixing member 310 is positioned, before or after positioning the shield 400, the fixing member 310 may be positioned. When producing a cell string, by positioning the fixing member 310 on the wiring portions 200 and 300, the fixing member 310 performs a function of fixing the cell string and thus a problem can be prevented that the cell string is separated during a moving process and a lamination process. Particularly, when positioning a fixing member on the solar cell C, a bubble may occur between the fixing member and the solar cell C by a thickness of the electrodes 141 and 142 and thus a seal characteristic may be deteriorated, but when the fixing member 310 is positioned at an outer edge of the solar cell C, particularly, between the solar cell C, even if a problem occurs by a bubble, a seal characteristic is not deteriorated.

Alternatively, as described above, when there is a problem in some solar cells C of a plurality of solar cells C constituting a cell string, the some solar cells C are replaced, the first and second conductive wirings 210 and 220 of the replaced new solar cell (NC of FIG. 16), the intercell connector 300 positioned at both sides thereof are connected, and each fixing member 310 may be additionally positioned at the intercell connector 300 positioned at both sides of the connected first and second conductive wirings 210 and 220 and the new solar cell NC. As described above, after the new solar cell NC is introduced, the first and second conductive wirings 210 and 220 and the intercell connector 300 may contact in a process different from an existing process. For example, after a worker manually introduces the new solar cell NC, by soldering the first and second conductive wirings 210 and 220 and the intercell connector 300, the first and second conductive wirings 210 and 220 and the intercell connector 300 contact and thus when the worker manually solders, adhesion of the first and second conductive wirings 210 and 220 and the intercell connector 300 may be deteriorated. In consideration of this, the fixing member 310 may be positioned to enclose the connecting portion CP of the intercell connector 300 and the first and second conductive wirings 210 and 220 of the replaced solar cell C and the solar cell C adjacent thereto.

In this instance, the fixing member 310 may include various materials that can fix the intercell connector 300 and the first and second conductive wirings 210 and 220. For example, the fixing member 310 may be configured with an insulating tape including a base member 310a and an attachment layer 310b positioned at one surface of the base member 310a and connected to the wiring portions 200 and 300. In this way, when the fixing member 310 is configured with a tape, the fixing member 310 may be fixed to a desired position by a simple process of attaching the tape.

The base member 310a may perform a function of enhancing strength of the fixing member 310. For example, a main component of the base member 310a may be a resin, and the base member 310a may include, for example, polyethylene (PE) and polyethylene terephthalate (PET).

The attachment layer 310b includes an adhesion material or a cohesion material and may be fixed to the conductive wiring 200 by adhesion or cohesion. Here, adhesion may mean that at least one layer is damaged when separating two layers because the two layers are physically perfectly attached, and cohesion may mean that two layers are fixed to attach or separate without damage by a predetermined physical force at a room temperature. When the attachment layer 310b includes an adhesion material, the attachment layer 310b may have a more excellent fixing characteristic. When the attachment layer 310b includes a cohesion material, even if the fixing member 310 is erroneously attached or even if the solar cell C is replaced or repaired, the fixing member 310 may be easily separated. For example, the attachment layer 310b may include an epoxy-based, acryl-based, or silicone-based adhesion material or cohesion material.

In this instance, a thickness T1 of the base member 310a may be equal to or larger than a thickness T2 of the attachment layer 310b. Thereby, strength of the fixing member 310 can be enhanced. For example, a thickness T1 of the base member 310a may be 100 um or less (for example, 50 um to 70 um), and a thickness T2 of the attachment layer 310b may be 100 um or less (for example, 10 um to 30 um). However, the present invention is not limited thereto and a thickness T1 of the base member 310a and a thickness T2 of the attachment layer 310b may have various values.

The fixing member 310 may be formed by coating an adhesion material or a cohesion material instead of being configured with an insulating tape. Such an example will be described in detail hereinafter with reference to FIGS. 25 to 27.

According to the present example embodiment, strength of the wiring portions 200 and 300 can be reinforced by the fixing member 310, and by preventing damage and separation of the wiring portions 200 and 300, fixing stability of the wiring portions 200 and 300 can be enhanced. The fixing member 310 prevents the wiring portions 200 and 300 from being unwantedly separated with penetration of fillers 20 and 30 between the wiring portions 200 and 300 and thus fixing stability can be further enhanced. Further, after the solar cell C having a failure or a fault is replaced, by positioning the fixing member 310 at an outer edge of the replaced solar cell C, fixing stability of the solar cell C can be largely enhanced. Therefore, output deterioration and a failure of the solar cell module can be prevented and long term reliability can be enhanced.

In the drawings, the fixing member 310 is positioned only between the first and second solar cells C1 and C2 while having a width W1 smaller than a gap D between the first and second solar cells C1 and C2 to be positioned with separated from the first and second solar cells C1 and C2 without being overlapped with the first and second solar cells C1 and C2. For example, the fixing member 310 may have a shape long connected in one line shape in a second direction while having a width and an area smaller than those of the shield 400. Accordingly, a material cost of the fixing member 310 can be reduced while enhancing fixing stability of the first and second conductive wirings 210 and 220 and the intercell connector 300.

Figure 19:
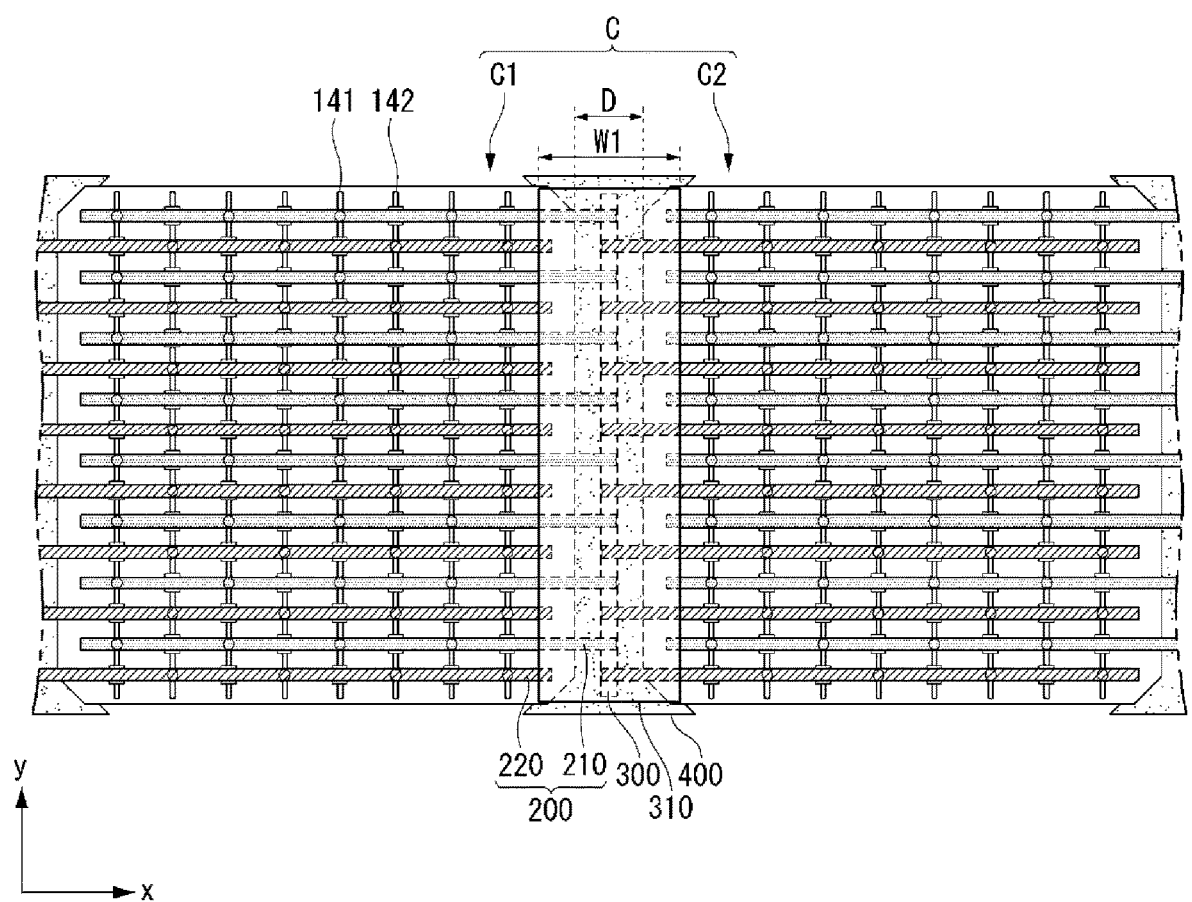
FIG. 19 is a rear plan view illustrating two solar cells, a conductive wiring, an intercell connector, an insulating layer, a first conductive adhesive, and a shield included in a solar cell module according to a modified example of an embodiment of the present invention.
Figure 20:
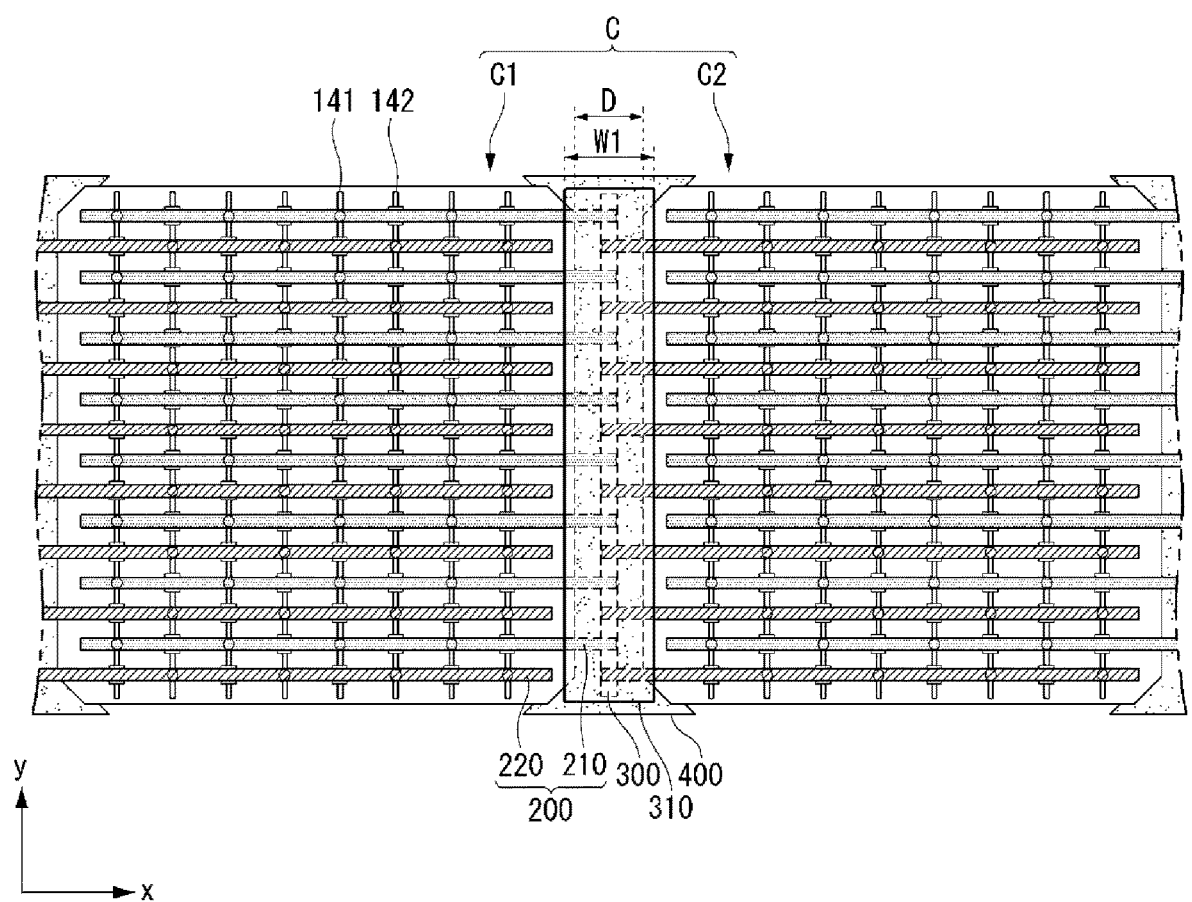
FIG. 20 is a rear plan view illustrating two solar cells, a conductive wiring, an intercell connector, an insulating layer, a first conductive adhesive, and a shield included in a solar cell module according to another modified example of an embodiment of the present invention.
Figure 21:
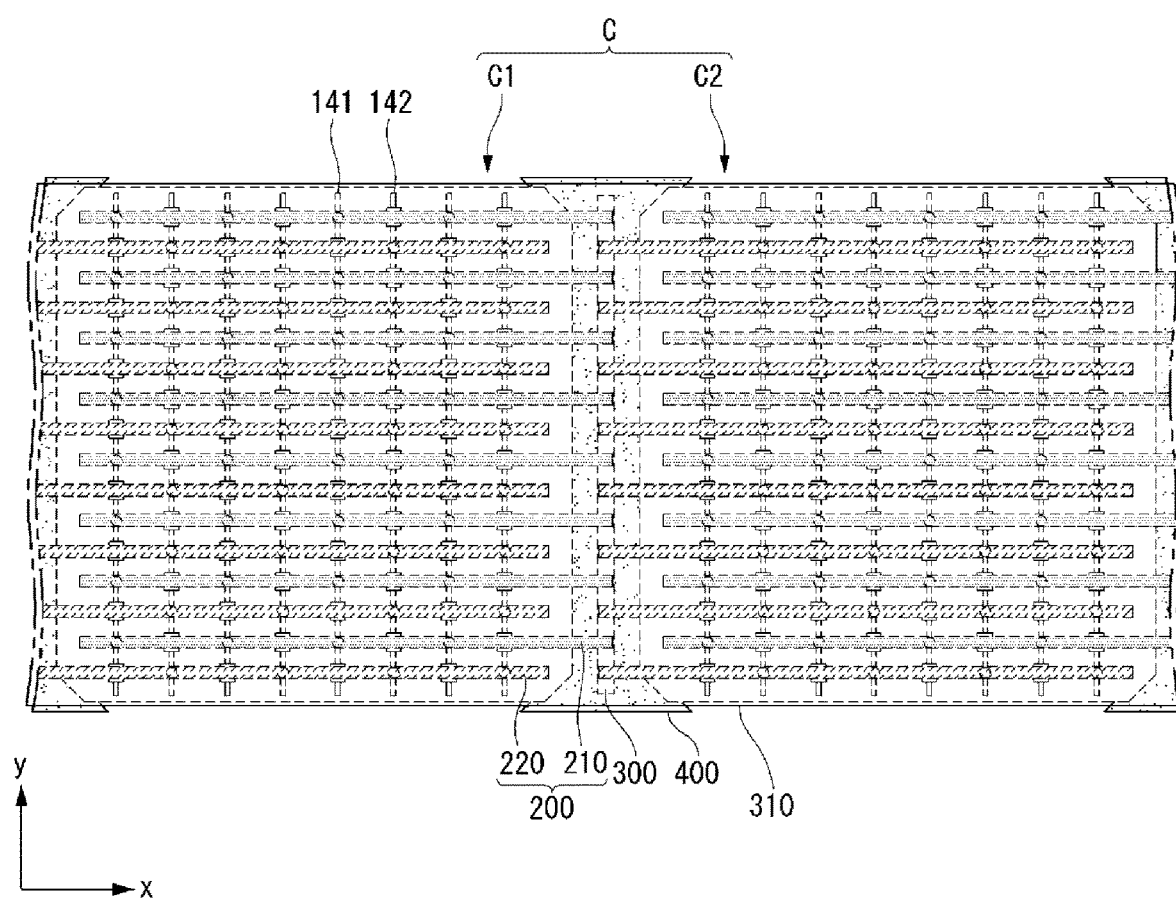
FIG. 21 is a rear plan view illustrating two solar cells, a conductive wiring, an intercell connector, an insulating layer, a first conductive adhesive, and a shield included in a solar cell module according to another modified example of an embodiment of the present invention.

However, the present invention is not limited thereto. Therefore, as shown in FIGS. 19 to 21, because a width W1 of the fixing member 310 is larger than a gap D between the first and second solar cells C1 and C2, the fixing member 310 may be positioned to overlap with a portion of at least an edge of the first and second solar cells C1 and C2. FIG. 19 illustrates that the fixing member 310 is positioned to entirely overlap with the first and second conductive wirings 210 and 220 on the first solar cell C1 and with the first and second conductive wirings 210 and 220 on the second solar cell C2. Accordingly, the fixing member 310 may additionally perform a function of fixing the first and second conductive wirings 210 and 220 to the first and second solar cells C1 and C2. Alternatively, in another example, as shown in FIG. 20, the fixing member 310 may be positioned to be overlapped with only the first conductive wiring 210 without being overlapped with the second conductive wiring 220 on the first solar cell C1 and to be overlapped with only the second conductive wiring 220 without being overlapped with the first conductive wiring 210 on the second solar cell C2. Therefore, while enhancing fixing stability by the fixing member 310, a width and an area of the fixing member 310 cannot increase. FIGS. 19 and 20 illustrate that the fixing member 310 is symmetrically formed based on the intercell connector 300, but the present invention is not limited thereto. Therefore, the fixing member 310 may be overlapped with only one of the first and second solar cells C1 and C2 and may not be overlapped with the remaining one. Various other changes are available.

In the foregoing example embodiment, the fixing member 310 has been partially formed between the first solar cell C1 and the second solar cell C1 and at only an edge portion of the first solar cell C1 and the second solar cell C1 adjacent thereto. In another example, as shown in FIG. 21, the fixing member 310 may be formed at an outer edge of the solar cell C and over the entire of at least one solar cell C. Therefore, fixing stability by the fixing member 310 can be maximized. For example, when the new solar cell NC is introduced by a failure and a fault, the fixing member 310 may be positioned between the replaced new solar cell NC and the new solar cell NC solar cell C positioned at both sides thereof and over the entire new solar cell NC.

Figure 22:
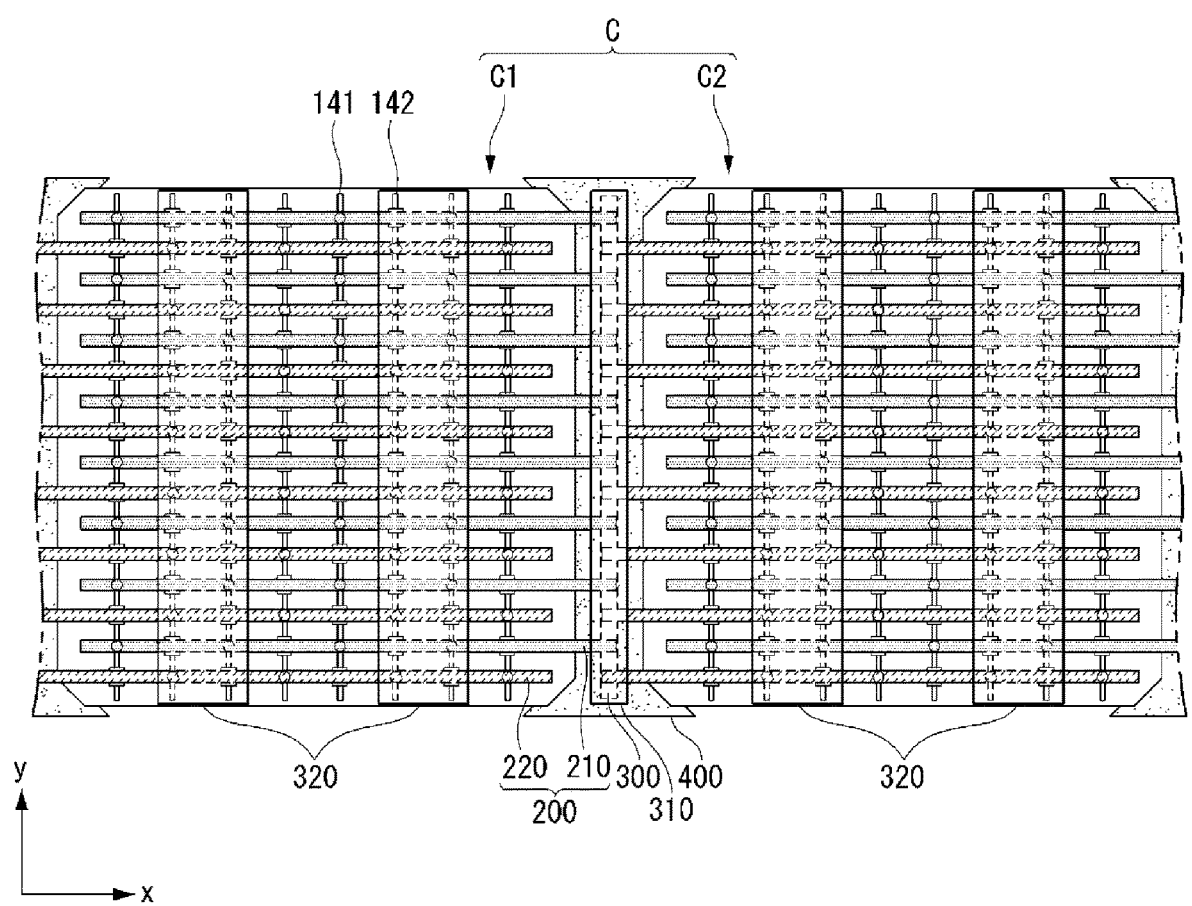
FIG. 22 is a rear plan view illustrating two solar cells, a conductive wiring, an intercell connector, an insulating layer, a first conductive adhesive, and a shield included in a solar cell module according to another modified example of an embodiment of the present invention.

In another example, as shown in FIG. 22, in addition to the fixing member 310, an internal fixing member 320 may be further provided on a plurality of solar cells C. The internal fixing member 320 may mean a fixing member in which most or the entire thereof is positioned to overlap within the solar cell C. In a process of producing a cell string by temporarily fixing the wiring portions 200 and 300 to the solar cell C, the internal fixing member 320 can prevent a problem that a position of the wiring portions 200 and 300 is twisted. Further, the internal fixing member 320 performs a function of securely fixing the wiring portions 200 and 300 to the solar cell C, thereby further enhancing durability of the solar cell module.

In this instance, the fixing member 310 and the internal fixing member 320 may have the same material or structure and may have different materials or structures. When the fixing member 310 and the internal fixing member 320 are formed with the same material or structure, by using the same insulating tape together with the fixing member 310 and the internal fixing member 320, a material cost can be reduced and a process can be simplified. When the fixing member 310 and the internal fixing member 320 have different materials or structures, the fixing member 310 may have strength and adhesion larger than those of the internal fixing member 320. As described above, a problem such as a bubble does not occur in the fixing member 310 and the fixing member 310 is positioned between the solar cells C that receive a large stress and thus it is advantageous that the fixing member 310 has relatively high strength and high adhesion. However, the present invention is not limited thereto. Therefore, the internal fixing member 320 may have strength and/or adhesion equal to or larger than that of the fixing member 310.

For example, similar to the base member 310a and the attachment layer 310b of the fixing member 310, when the internal fixing member 320 has an insulating tape form including a base portion and a fixing portion, a base portion of the internal fixing member 320 may include polyethylene terephthalate or polyimide (PI), and the fixing portion may include an epoxy-based, acrylic-based, or silicon-based adhesion material or cohesion material. However, the present invention is not limited thereto.

The fixing member 310 and the internal fixing member 320 may have the same width. When the fixing member 310 and the internal fixing member 320 have the same width, by using the same insulating tape together with the fixing member 310 and the internal fixing member 320, a material cost can be reduced and a process can be simplified. When the fixing member 310 and the internal fixing member 320 have different widths, a width of the internal fixing member 320 may be larger than that of the fixing member 310. Thereby, by the internal fixing member 320 of the small number, the wiring portions 200 and 300 may be fixed to the solar cell C with a sufficient area. However, the present invention is not limited thereto and a width of the fixing member 310 may be equal to or larger than that of the internal fixing member 320.

In the foregoing description, the first and second conductive wirings 210 and 220 and the intercell connector 300 have been formed in a separate layer or structure and have been connected. Accordingly, by fixing the first and second conductive wirings 210 and 220 on each solar cell C, by positioning a plurality of solar cells C in parallel, and by connecting the intercell connector 300 to the first and second conductive wirings 210 and 220, a cell string may be formed. Thereby, a process of forming a cell string can be simplified. However, the present invention is not limited thereto and another example will be described in detail hereinafter with reference to FIG. 27.

Further, in the foregoing description, in a portion in which a connecting portion CP of the conductive wiring 200 and the intercell connector 300 is positioned, the fixing member 310 has been positioned. However, because a busbar wiring is a kind of connection wiring connected to the conductive wiring 200, the fixing member 310 may be positioned in a portion in which a connecting portion of the conductive wiring 200 and the busbar wiring is positioned. In this instance, a description of the conductive wiring 200 and the intercell connector 300 and the fixing member 310 thereof may be applied to the conductive wiring 200 and the busbar wiring and the fixing member 310 thereof. Various other changes are available.

FIGS. 19 to 21 illustrate that the fixing member 310 is positioned at only a space between the first solar cell C1 and the second solar cell C2 (i.e., one side of each of the first solar cell C1 and the second solar cell C2 adjacent to each other), but the fixing member 310 may be positioned at another one side of the first solar cell C1 and/or another one side of the second solar cell C2. For example, when the first solar cell C1 is a new solar cell NC replaced by repair, at one side and the other side of the first solar cell C1 of a second direction, each fixing members 310 may be positioned.

Figure 23:
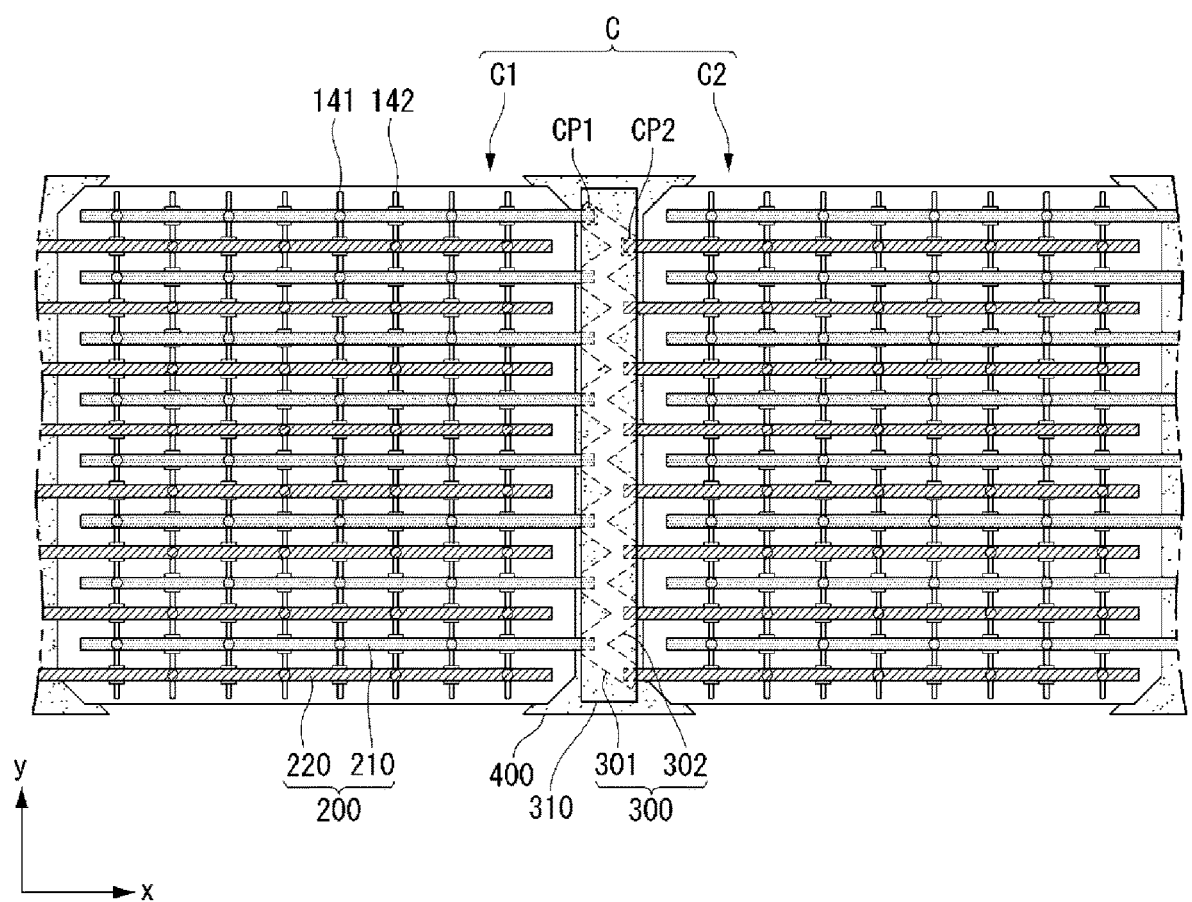
FIG. 23 is a rear plan view illustrating two solar cells, a conductive wiring, an intercell connector, an insulating layer, a first conductive adhesive, and a shield included in a solar cell module according to another example embodiment of the present invention.

FIG. 23 is a rear plan view illustrating two solar cells C, a conductive wiring 200, an intercell connector 300, an insulating layer 252, a first conductive adhesive 251, and a shield 400 included in a solar cell module according to another example embodiment of the present invention.

FIG. 23 is a rear plan view illustrating two solar cells C, a conductive wiring 200, an intercell connector 300, an insulating layer 252, a first conductive adhesive 251, and a shield 400 included in a solar cell module according to another example embodiment of the present invention.

Referring to FIG. 23, in the present example embodiment, the intercell connector 300 includes a portion extended in first and second directions (y-axis and x-axis direction of the drawing) and inclined third direction and fourth directions. More accurately, the intercell connector 300 includes a first portion 301 extended in first and second directions and inclined third direction and fourth directions and a second portion 302 extended in first and second directions and a fourth direction intersecting an inclined third direction. More specifically, in order to connect one of the first conductive wirings 210 of the first solar cell C1 and one of the second conductive wiring 220 of the second solar cell C2 separated in first and second directions therefrom and most adjacent to one of the first conductive wiring 210, the first portion 301 is extended in a third direction. In order to connect one of the second conductive wiring 220 and the other one of the first conductive wiring 210 of the first solar cell C1 separated in first and second directions therefrom and most adjacent to one of the second conductive wiring 220, the second portion 302 is extended in a fourth direction. When viewed in a first direction (y-axis direction of the drawing), the first portion 301 and the second portion 302 are alternately positioned and thus the intercell connector 300 may have a kind of zigzag shape. In this way, when the intercell connector 300 has a zigzag shape, by reducing a length of the first and second conductive wirings 210 and 220, a length difference by contraction and expansion of the first and second conductive wirings 210 and 220 may be reduced. Separation and damage of the intercell connector 300 and the first and second conductive wirings 210 and 220 that may occur by contraction and expansion of the first and second conductive wirings 210 and 220 by a stress can be prevented and twist of the intercell connector 300 can be prevented.

The intercell connector 300 of such a shape may be intentionally formed and may be naturally formed after a connection to the first and second conductive wirings 210 and 220.

As shown in FIG. 17, the fixing member 310 may have a width smaller than a gap of the first and second solar cells C1 and C2, however the present invention is not limited thereto. Therefore, as shown in FIGS. 19 to 22, the fixing member 310 may have a width larger than a gap of the first and second solar cells C1 and C2 to be overlapped with at least a portion of the first and second solar cells C1 and C2.

Figure 24:
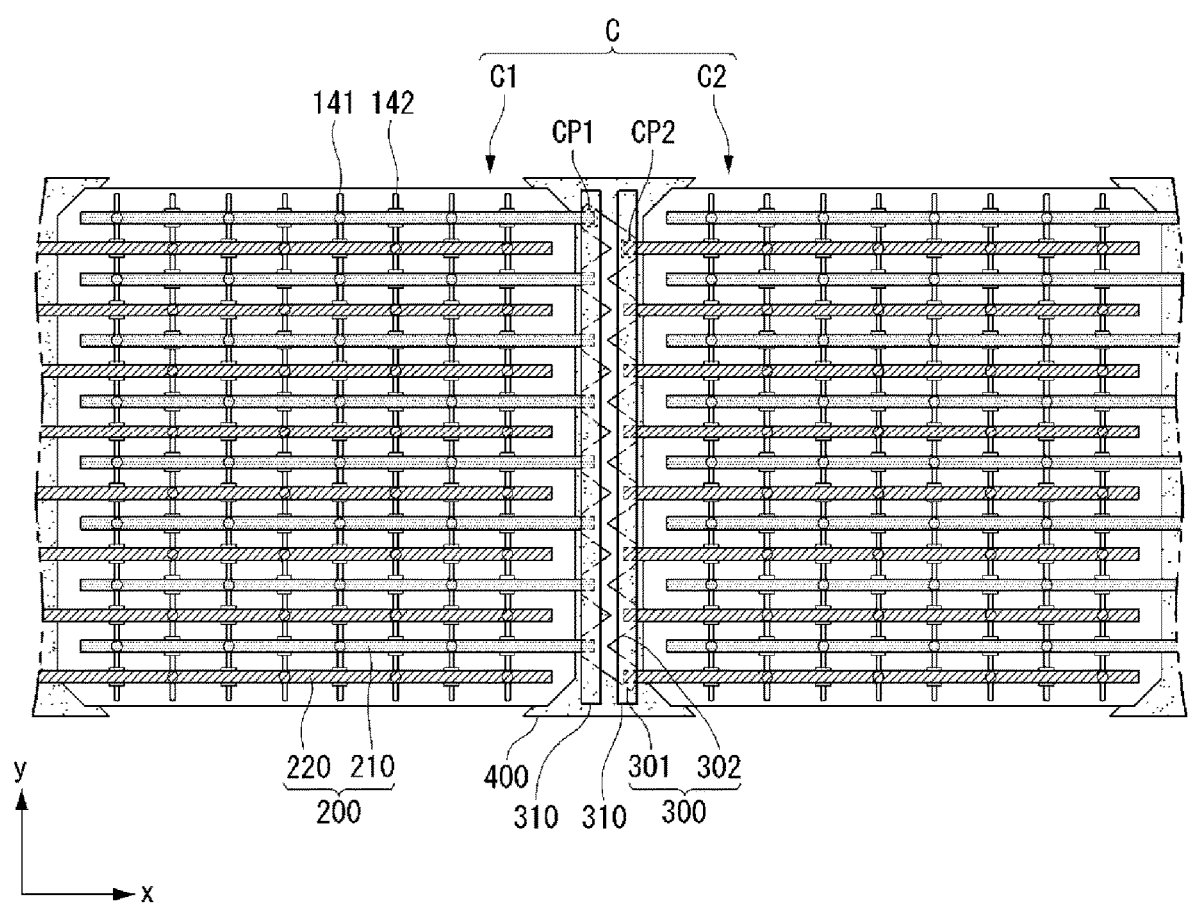
FIG. 24 is a rear plan view illustrating two solar cells, a conductive wiring, an intercell connector, an insulating layer, a first conductive adhesive, and a shield included in a solar cell module according to another modified example of an embodiment of the present invention.

In the present example embodiment, in order to overlap with the entire intercell connector 300 of a zigzag shape, the fixing member 310 has a width larger than a maximum width of the intercell connector 300 in a second direction and thus one fixing member 310 is entirely overlapped with the first and second connection portions CP1 and CP2 of the intercell connector 300 and the first and second conductive wirings 210 and 220 to enclose the first and second connection portions CP1 and CP2. However, the present invention is not limited thereto. Therefore, as shown in FIG. 24, one fixing member 310 may be overlapped with only the first connecting portion CP1 of the intercell connector 300 and the first conductive wiring 210 without being overlapped with the second connecting portion CP2, and another fixing member 310 may be overlapped with only the second connecting portion CP2 of the intercell connector 300 and the second conductive wiring 220 without being overlapped with the first connecting portion CP1. Therefore, the fixing member 310 may fix and enclose the entire first and second connection portions CP1 and CP2 while minimizing an area of the fixing member 310.

Figure 25:
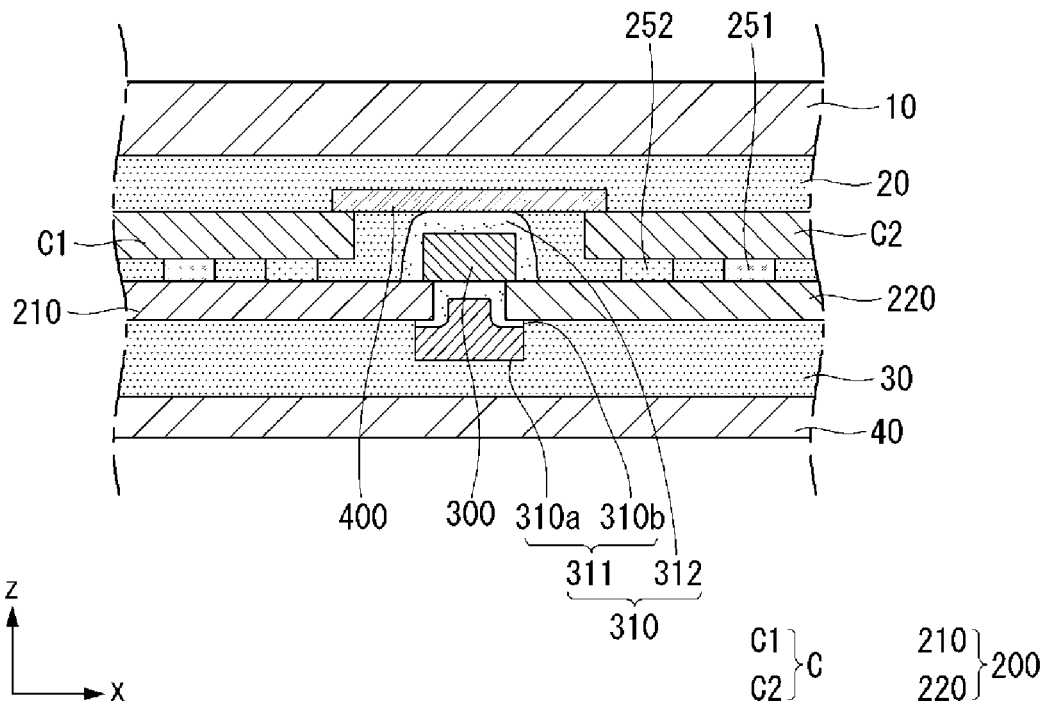
FIG. 25 is a partial cross-sectional view of a solar cell module according to another example embodiment of the present invention.

FIG. 25 is a partial cross-sectional view of a solar cell module according to another example embodiment of the present invention. For reference, FIG. 25 illustrates a portion corresponding to FIG. 2.

Referring to FIG. 25, in the present example embodiment, the fixing member 310 includes a first fixing member 311 and a second fixing member 312 positioned at both surfaces of the wiring portions 200 and 300, respectively.

In the drawings, for example, the fixing member 310 may include a first fixing member 311 configured with an insulating tape positioned at a rear surface of the first and second conductive wirings 210 and 220 and the intercell connector 300 and a second fixing member 312 configured with a paste positioned at a front surface of the first and second conductive wirings 210 and 220 and the intercell connector 300. A description on the fixing member 310 described in the foregoing example embodiment may be applied to the first fixing member 311 and therefore a detailed description thereof will be omitted. After the first and second conductive wirings 210 and 220 and the intercell connector 300 are connected, before positioning the shield 400, by coating a paste at a front surface of the first and second conductive wirings 210 and 220 and the intercell connector 300, the second fixing member 312 may be formed. A paste constituting the second fixing member 312 may be various materials including a cohesion material or an adhesion material. As a cohesion material or a adhesion material, an epoxy-based, acrylic-based, or silicon-based material may be used. In this way, when forming the second fixing member 312 using a paste, the second fixing member 312 may be formed at a front surface of the wiring portions 200 and 300 with a simple process.

In this way, when both the first fixing member 311 and the second fixing member 312 are provided, adhesion of the first and second conductive wirings 210 and 220 and the intercell connector 300 can be enhanced and adhesion of the shield 400 can be also enhanced. Particularly, because the second fixing member 312 may fill a gap between the shield 400 and the intercell connector 300, the shield 400 is attached in a flat state and thus fixing stability can be more enhanced.

However, the present invention is not limited thereto. Therefore, at a rear surface of the intercell connector 300 and the first and second conductive wirings 210 and 220, the second fixing member 312 formed by coating a paste may be positioned and/or at a front surface of the first and second conductive wirings 210 and 220 and the intercell connector 300, the first fixing member 311 configured with an insulating tape may be positioned. The drawings illustrate that the fixing member 310 positioned at both surfaces has different first and second fixing members 311 and 312, but the present invention is not limited thereto. The entire fixing member 310 positioned at both surfaces may be configured with the first fixing member 311 or the second fixing member 312. Various other changes are available.

Figure 26:
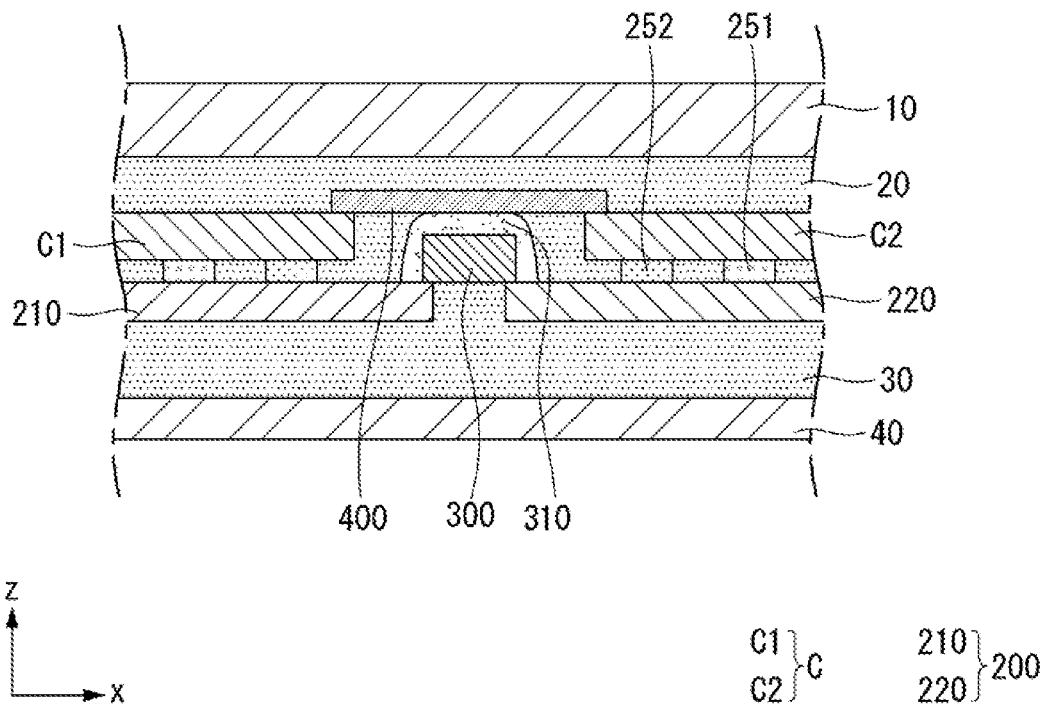
FIG. 26 is a partial cross-sectional view of a solar cell module according to another modified example of an embodiment of the present invention.

Alternatively, as shown in FIG. 26, at only a front surface of the intercell connector 300 and the first and second conductive wirings 210 and 220, the fixing member 310 may be positioned. FIG. 26 illustrates that the fixing member 310 positioned at a front surface of the first and second conductive wirings 210 and 220 and the intercell connector 300 is formed by coating a paste, but the present invention is not limited thereto. Therefore, as shown in FIG. 26, the fixing member 310 positioned at a front surface of the intercell connector 300 and the first and second conductive wirings 210 and 220 may be configured with an insulating tape. Various other changes are available.

Figure 27:
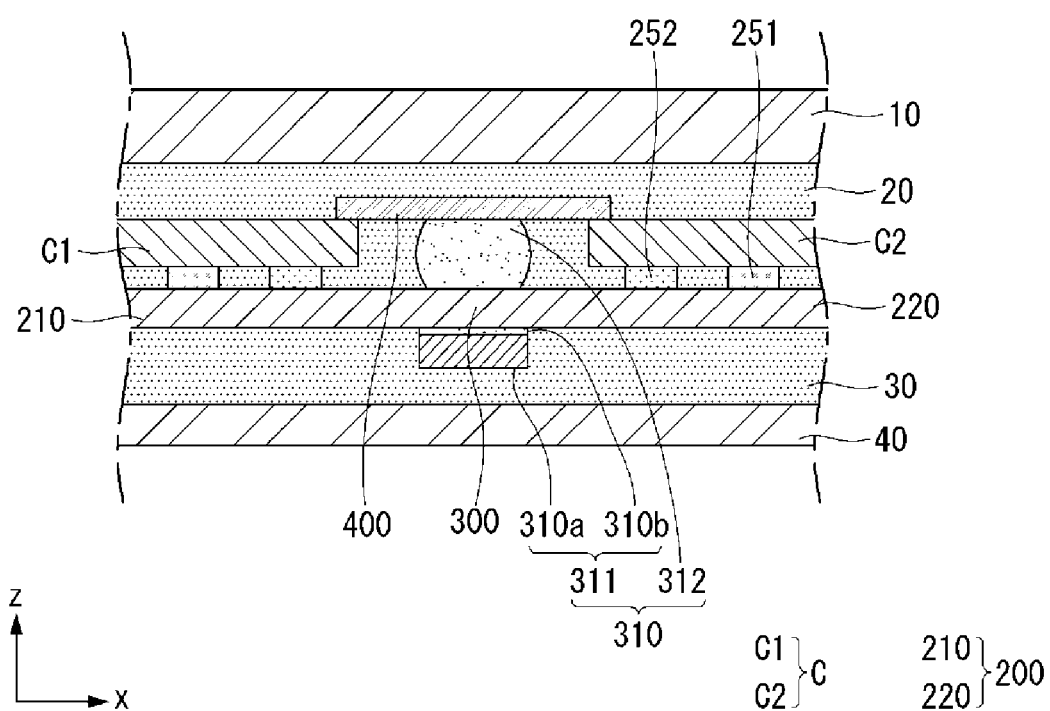
FIG. 27 is a partial cross-sectional view of a solar cell module according to another example embodiment of the present invention.

FIG. 27 is a partial cross-sectional view of a solar cell module according to another example embodiment of the present invention. For reference, FIG. 27 illustrates a portion corresponding to FIG. 2.

Referring to FIG. 27, the first and second conductive wirings 210 and 220 and the intercell connector 300 may have an integral structure formed with the same layer. In this instance, the fixing member 310 may be positioned in at least one surface of the intercell connector 300 and the first and second conductive wirings 210 and 220 having an integral structure. In the present example embodiment, the fixing member 310 may perform a function of reinforcing strength of the first and second conductive wirings 210 and 220 and the intercell connector 300 and more securely fixing the shield 400.

As shown in FIG. 27, for example, the fixing member 310 may include a first fixing member 311 configured with an insulating tape positioned at a rear surface of the first and second conductive wirings 210 and 220 and the intercell connector 300 and a second fixing member 312 formed using a paste positioned a front surface of the first and second conductive wirings 210 and 220 and the intercell connector 300, however the present invention is not limited thereto. Therefore, the second fixing member 312 formed using a paste may be positioned at a rear surface of the first and second conductive wirings 210 and 220 and the intercell connector 300 and/or the first fixing member 311 configured with an insulating tape may be positioned at a front surface of the first and second conductive wirings 210 and 220 and the intercell connector 300. The fixing member 310 may be positioned at only one surface of a front surface and a rear surface of the first and second conductive wirings 210 and 220 and the intercell connector 300.

FIG. 27 illustrates that the fixing member 310 positioned at both surfaces has different first and second fixing member 311, 312, however the present invention is not limited thereto. The entire fixing member 310 positioned at both surfaces may be configured with the first fixing member 311 or the second fixing member 312. Various other changes are available.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a solar cell module, the method comprising:

forming a plurality of strings using a plurality of solar cells arranged in a first direction by commonly connecting a plurality of conductive wirings fixed to a rear surface of each of the plurality of solar cells to a rear surface of a plurality of intercell connectors disposed between the plurality of solar cells, respectively;

testing a defect of each of the plurality of solar cells included in each of the plurality of strings to find a target solar cell having the defect among the plurality of string;

disposing a target string among the plurality of strings at a repair device such that a rear surface of the target string faces upward, the target string comprising the target solar cell having the defect;

separating the target solar cell from the target string by selectively thermally processing a connection area of a target intercell connector among the plurality of intercell connector and the plurality of conductive wirings fixed to the target solar cell in the target string;

disposing a new solar cell at the target string such that conductive wirings fixed to the new solar cell are overlapped with the target intercell connector; and connecting the conductive wirings fixed to the new solar cell to the target intercell connector by selectively thermally processing an overlapping area of the target intercell connector and the conductive wirings fixed to the new solar cell.

2. The method of claim 1, wherein the plurality of conductive wirings fixed to the rear surface of each of the plurality of solar cells comprise a plurality of first and second conductive wirings having different polarities, in the forming of the plurality of strings, the plurality of intercell connectors are disposed between the plurality of solar cells, respectively in a second direction intersecting the first direction, and the plurality of strings are respectively formed by thermally processing the plurality of conductive wirings in a state in which the plurality of conductive wirings connected to the plurality of solar cells respectively are commonly overlapped with the plurality of intercell connectors, and the plurality of intercell connectors and the plurality of conductive wirings fixed to the plurality of solar cells respectively are connected by a conductive adhesive.

3. The method of claim 1, wherein in the separating of the target solar cell, an area is selectively thermally processed, the area being where the target intercell connector and the plurality of conductive wirings fixed to the target solar cell are connected, and in the separating of the target solar cell, an area is not thermally processed, the area being where the target intercell connector and the plurality of conductive wirings fixed to a normal cell are connected.

4. The method of claim 1, wherein in the connecting of the conductive wirings, a thermal processing is performed in a state in which the conductive adhesive is additionally supplied between the target intercell connector and the conductive wirings fixed to the new solar cell, and after the connecting of the conductive wirings, a coating area of the conductive adhesive that bonds the conductive wirings of the new solar cell on the target intercell connector is larger than that of a conductive adhesive that bonds a plurality of conductive wirings fixed to a normal cell.

5. The method of claim 1, wherein in the plurality of strings, a shield that visually blocks the intercell connector is further provided at a front surface of the intercell connector, wherein the method further comprises, before the separating of the target solar cell after the disposing of the target string:

overturning, by the repair device, the target string such that a front surface of the target string faces upward;

removing the shield positioned at the front surface of the target intercell connector in the target string; and overturning, by the repair device, the target string such that a rear surface of the target string faces upward after the shield is removed.

6. The method of claim 1, further comprising, after the connecting of the conductive wirings, attaching a fixing member that fixes the plurality of intercell connectors on the plurality of intercell connectors.

* * * * *